(12) United States Patent
Kim et al.

(10) Patent No.: US 12,319,841 B2
(45) Date of Patent: Jun. 3, 2025

(54) SLURRY COMPOSITION FOR CHEMICAL MECHANICAL POLISHING

(71) Applicant: SAMSUNG ELECTRONICS CO., LTD., Suwon-si (KR)

(72) Inventors: Inkwon Kim, Hwaseong-si (KR); Yearin Byun, Hwaseong-si (KR); Sangkyun Kim, Hwaseong-si (KR); Sanghyun Park, Hwaseong-si (KR); Hyosan Lee, Hwaseong-si (KR); Wonki Hur, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 51 days.

(21) Appl. No.: 17/860,351

(22) Filed: Jul. 8, 2022

(65) Prior Publication Data

US 2023/0104949 A1    Apr. 6, 2023

(30) Foreign Application Priority Data

Aug. 13, 2021    (KR) .......................... 10-2021-0107532

(51) Int. Cl.
| | |
|---|---|
| C09G 1/00 | (2006.01) |
| B24B 1/00 | (2006.01) |
| B24B 37/04 | (2012.01) |
| C09G 1/04 | (2006.01) |
| C09G 1/06 | (2006.01) |
| C09G 1/18 | (2006.01) |
| C09K 3/14 | (2006.01) |
| C09K 13/06 | (2006.01) |
| H01L 21/306 | (2006.01) |
| H01L 21/321 | (2006.01) |

(52) U.S. Cl.
CPC ................. *C09G 1/00* (2013.01); *B24B 1/00* (2013.01); *B24B 37/044* (2013.01); *C09G 1/04* (2013.01); *C09G 1/06* (2013.01); *C09G 1/18* (2013.01); *C09K 3/1454* (2013.01); *C09K 13/06* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 7,452,817 | B2 | 11/2008 | Yoon et al. |
| 7,504,044 | B2 | 3/2009 | Carter et al. |
| 7,754,612 | B2 | 7/2010 | Lu |
| 8,440,094 | B1 | 5/2013 | Guo et al. |
| 9,097,994 | B2 | 8/2015 | Babu et al. |
| 9,434,046 | B2 | 9/2016 | Shimizu et al. |

(Continued)

FOREIGN PATENT DOCUMENTS

| | | |
|---|---|---|
| KR | 10-1761789 B1 | 7/2017 |
| KR | 10-2019-0072234 A | 6/2019 |
| KR | 10-2020-0061796 A | 6/2020 |

*Primary Examiner* — Jiong-Ping Lu
(74) *Attorney, Agent, or Firm* — Muir Patent Law, PLLC

(57) ABSTRACT

A slurry composition for a chemical mechanical polishing (CMP) process, the slurry composition including a first organic polishing booster including a quaternary amine group; a second organic polishing booster including an amino acid; and a carrier; wherein inorganic polishing particles are not included in the slurry composition or included in an amount of less than 0.01% by weight.

21 Claims, 27 Drawing Sheets

(56) References Cited

U.S. PATENT DOCUMENTS

| | | |
|---|---|---|
| 10,418,247 B2 | 9/2019 | Murella et al. |
| 10,494,547 B2 | 12/2019 | Kwon et al. |
| 2005/0026437 A1 | 2/2005 | Ma et al. |
| 2008/0182413 A1* | 7/2008 | Menk .................. C09G 1/04 257/E21.244 |
| 2010/0163786 A1* | 7/2010 | Izumi ................ H01L 21/02024 252/79.1 |
| 2012/0190200 A1 | 7/2012 | Penta et al. |
| 2014/0191155 A1* | 7/2014 | Reiss ................ H01L 21/02024 252/79.1 |
| 2021/0062043 A1* | 3/2021 | Brosnan .................. C09G 1/06 |
| 2021/0071034 A1 | 3/2021 | Theivanayagam et al. |

\* cited by examiner

SLURRY COMPOSITION FOR CHEMICAL MECHANICAL POLISHING

CROSS-REFERENCE TO RELATED APPLICATION

This application is based on and claims priority under 35 U.S.C. § 119 to Korean Patent Application No. 10-2021-0107532, filed on Aug. 13, 2021, in the Korean Intellectual Property Office, the disclosure of which is incorporated by reference herein in its entirety.

BACKGROUND

1. Field

Embodiments relate to a slurry composition for a chemical mechanical polishing (CMP) process.

2. Description of the Related Art

In general, polishing agents (or abrasives), e.g., inorganic polishing particles, may be added to a slurry composition for a CMP process.

SUMMARY

The embodiments may be realized by providing a slurry composition for a chemical mechanical polishing (CMP) process, the slurry composition including a first organic polishing booster including a quaternary amine group; a second organic polishing booster including an amino acid; and a carrier; wherein inorganic polishing particles are not included in the slurry composition or included in an amount of less than 0.01% by weight.

The embodiments may be realized by providing a slurry composition for a chemical mechanical polishing (CMP) process, the slurry composition including a first organic polishing booster including a quaternary amine group, the first organic polishing booster being included in the slurry composition in an amount of about 10 ppm to about 100,000 ppm by weight; a second organic polishing booster including an amino acid, the second organic polishing booster being included in the slurry composition in an amount of about 10 ppm to about 100,000 ppm by weight; and a surfactant; and a carrier, wherein the slurry composition is essentially free of inorganic polishing particles.

The embodiments may be realized by providing a slurry composition for a chemical mechanical polishing (CMP) process for polishing polysilicon, the slurry composition including a first organic polishing booster including a quaternary amine group; a second organic polishing booster including an amino acid; a surfactant; a pH control agent; and a carrier, wherein the slurry composition has a pH value of about 4 to about 11, does not include inorganic polishing particles, and does not include a dispersion stabilizer for uniform distribution of the inorganic polishing particles.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
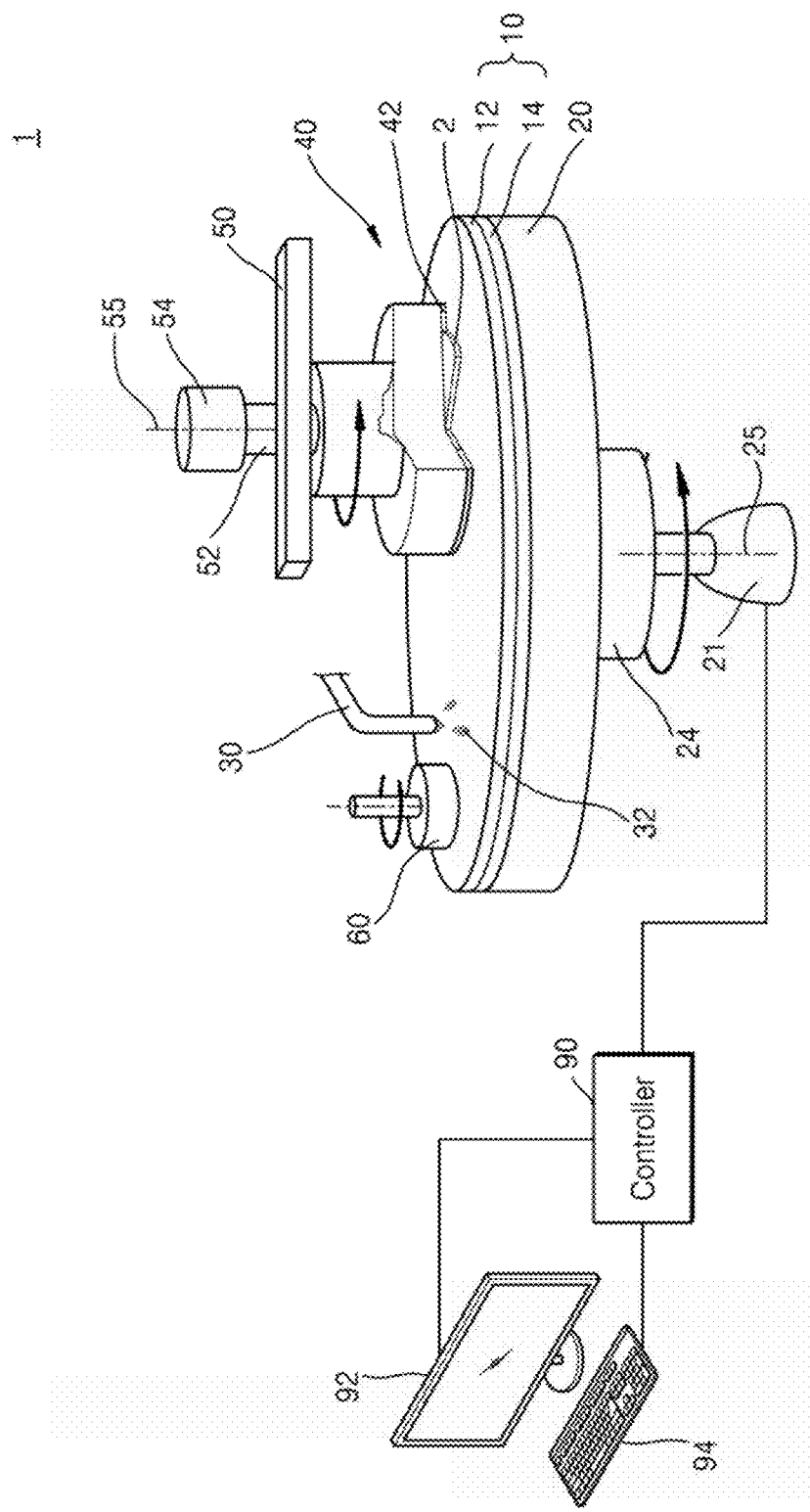
FIG. 1 is a conceptual perspective view of a polishing apparatus capable of performing a chemical mechanical polishing (CMP) process.

FIG. 1 is a conceptual perspective view of a polishing apparatus 1 capable of performing a chemical mechanical polishing (CMP) process.

Referring to FIG. 1, the polishing apparatus 1 may include a platen 20 having a rotating disc shape on which a polishing pad 10 is placed. The platen 20 may be capable of rotating about a central axis 25 thereof. In an implementation, a motor 21 may turn a driving axis 24 to rotate the platen 20. The polishing pad 10 may be a polishing pad having at least two layers including an outer polishing layer 12 and a backing layer 14 that is more flexible than the outer polishing layer 12.

The polishing apparatus 1 may include a slurry port 30 configured to dispense a polishing agent 32 (e.g., slurry) toward the polishing pad 10. The polishing apparatus 1 may include a polishing pad conditioner 60 configured to condition the polishing pad 10 so that the polishing pad 10 may be maintained in a consistent polishing state.

The polishing apparatus 1 may include at least one carrier head 40. The carrier head 40 may be configured to hold a substrate 2 against the polishing pad 10. The carrier head 40 may independently control polishing parameters (e.g., pressure) associated with each substrate.

In an implementation, the carrier head 40 may include a retaining ring 42 to hold the substrate 2 under a flexible membrane. The carrier head 40 may include a plurality of pressurizable chambers, which may be defined by the flexible membrane and controlled independently. The plurality of pressurizable chambers may independently apply controllable pressures to associated zones of the flexible membrane and the substrate 2.

The carrier head 40 may hang from a support structure 50 (e.g., a carousel or a track) and be connected to a carrier head rotational motor 54 by a driving axis 52, and thus, the carrier head 40 may rotate about a central axis 55. In an implementation, the carrier head 40 may oscillate in a lateral direction, e.g., on a slider on the carousel or the track or oscillate due to rotary oscillation of the carousel. During operation, the platen 20 may rotate about the central axis 25 thereof, and the carrier head 40 may rotate the central axis 55 thereof and be translated across a top surface of the polishing pad 10 in the lateral direction.

In an implementation, as illustrated in the drawings, one carrier head 40 may be included, or at least two carrier heads for maintaining additional substrates may be provided to efficiently use a surface area of the polishing pad 10.

The polishing apparatus 1 may also include a control system configured to control rotation of the platen 20. The control system may include a controller 90 (e.g., a general-use programmable digital computer), an output device 92 (e.g., a monitor), and an input device 94 (e.g., a keyboard).

In an implementation, as illustrated in the drawings, the control system may be connected only to the motor 21, or the control system may be also connected to the carrier head 40 and control a pressure or rotation speed of the carrier head 40. In an implementation, the control system may be connected to the slurry port 30 and control the supplying of slurry.

An embodiment provides a slurry composition for a CMP process, which may be used for the polishing apparatus 1.

The slurry composition may include, e.g., a first organic polishing booster, a second organic polishing booster, and a carrier. In an implementation, the slurry composition may consist essentially of, e.g., a first organic polishing booster, a second organic polishing booster, and a carrier. In an implementation, the slurry composition may consist of, e.g., a first organic polishing booster, a second organic polishing booster, and a carrier. In an implementation, the slurry composition may consist essentially of, e.g., a first organic polishing booster, a second organic polishing booster, a surfactant, a pH control agent, and a carrier. In an implementation, the slurry composition may consist essentially of, e.g., a first organic polishing booster, a second organic polishing booster, a surfactant, and a carrier.

First Organic Polishing Booster

The first organic polishing booster may be, e.g., an oligomer or polymer including a quaternary amine group.

In an implementation, the first organic polishing booster may have a molecular weight of, e.g., about 1,000 to about 1,000,000. The molecular weight may be a weight average molecular weight. In an implementation, a molecular weight of the first organic polishing booster may be in a range of, e.g., about 1,000 to about 1,000,000, about 2,000 to about 950,000, about 4,000 to about 900,000, about 7,000 to about 850,000, about 10,000 to about 800,000, about 20,000 to about 750,000, about 40,000 to about 700,000, about 70,000 to about 650,000, about 100,000 to about 600,000, about 120,000 to about 580,000, about 140,000 to about 560,000, about 170,000 to about 540,000, about 200,000 to about 500,000, or any range between the values described above.

The weight average molecular weight may be, e.g., measured by gel permeation chromatography (GPC) using polystyrene as a standard.

Maintaining the molecular weight of the first organic polishing booster at about 1,000 or greater may help prevent a reduction in a polishing rate. Maintaining the molecular weight of the first organic polishing booster at about 1,000,000 or less may help ensure that dispersibility is not lowered and thus help ensure that polishing is uniform.

The first organic polishing booster may be included in the slurry composition for the CMP process in an amount of, e.g., about 10 ppm to about 100,000 ppm by weight (e.g., based on a total weight of the slurry composition). In an implementation, the first organic polishing booster may be included in an amount of, e.g., about 20 ppm to about 95,000 ppm by weight, about 50 ppm to about 90,000 ppm by weight, about 80 ppm to about 85,000 ppm by weight, about 100 ppm to about 80,000 ppm by weight, about 200 ppm to about 75,000 ppm by weight, about 500 ppm to about 70,000 ppm by weight, about 800 ppm to about 65,000 ppm by weight, about 1,000 ppm to about 60,000 ppm by weight, about 2,000 ppm to about 55,000 ppm by weight, about 5,000 ppm to about 50,000 ppm by weight, about 8,000 ppm to about 45,000 ppm by weight, about 10,000 ppm to about 40,000 ppm by weight, or any range between the values described above.

Maintaining the amount of the first organic polishing booster at about 100,000 ppm or less may help ensure that a polishing rate is easily controllable. Maintaining the amount of the first organic polishing booster at about 10 ppm or greater may help ensure that a polishing effect is satisfactory.

In an implementation, the first organic polishing booster may include a moiety (e.g., repeating unit) represented by one of Formula 1 to 6.

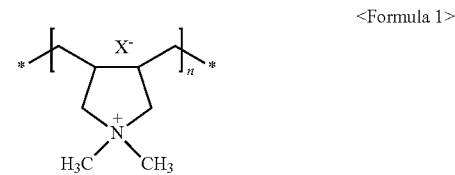

<Formula 1>

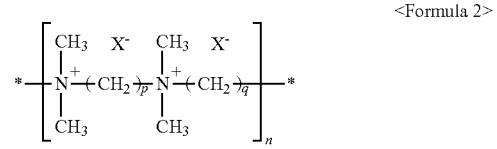

<Formula 2>

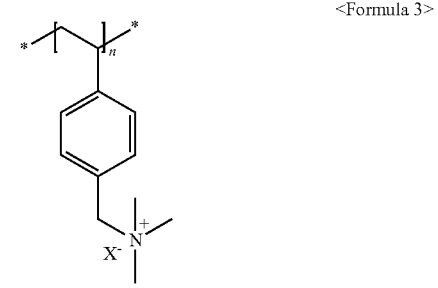

<Formula 3>

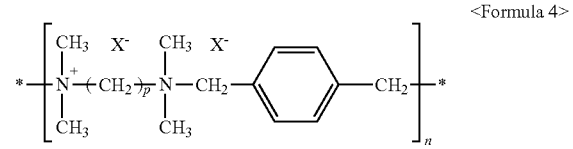

<Formula 4>

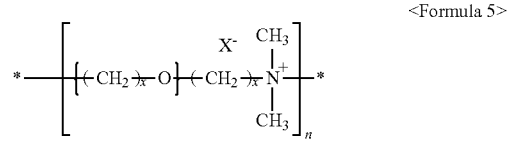

<Formula 5>

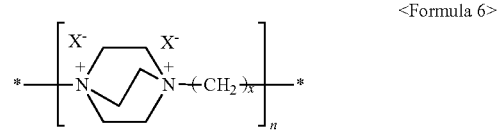

<Formula 6>

In Formulae 1 to 6, X may be, e.g., fluorine (F), chlorine (Cl), bromine (Br), or iodine (I). p, q, and x may each independently be, e.g., an integer of 1 to 5. n may be, e.g., an integer that allows a molecular weight of the first organic polishing booster to be in a range of 1,000 to 1,000,000. * may be a bonding location to an adjacent atom. As used herein, the term "or" is not an exclusive term, e.g., "A or B" would include A, B, or A and B.

Second Organic Polishing Booster

The second organic polishing booster may include, e.g., an amino acid.

In an implementation, the second organic polishing booster may include, e.g., arginine, histidine, lysine, aspartic acid, glutamic acid, serine, threonine, asparagine, glutamine, cysteine, selenocysteine, glycine, proline, alanine, valine, leucine, isoleucine, methionine, phenylalanine, tyrosine, or tryptophan.

The second polishing booster may be included in an amount of, e.g., about 10 ppm to about 100,000 ppm by weight, based on a total weight of the slurry composition for the CMP process. In an implementation, the second organic polishing booster may be included in an amount of, e.g., about 20 ppm to about 95,000 ppm by weight, about 50 ppm to about 90,000 ppm by weight, about 80 ppm to about 85,000 ppm by weight, about 100 ppm to about 80,000 ppm by weight, about 200 ppm to about 75,000 ppm by weight, about 500 ppm to about 70,000 ppm by weight, about 800 ppm to about 65,000 ppm by weight, about 1,000 ppm to about 60,000 ppm by weight, about 2,000 ppm to about 55,000 ppm by weight, about 5,000 ppm to about 50,000 ppm by weight, about 8,000 ppm to about 45,000 ppm by weight, about 10,000 ppm to about 40,000 ppm by weight, or any range between the values described above.

Maintaining the amount of the second organic polishing booster at about 100,000 ppm or less may help ensure that a polishing rate is easier to control. Maintaining the amount of the second organic polishing booster at about 10 ppm or greater may help ensure that a polishing effect is satisfactory.

When the first organic polishing booster is combined with the second organic polishing booster, a removal rate of a polysilicon material film may be greatly increased, as compared to a slurry composition containing a polishing agent. In addition, an etch selectivity between the polysilicon material film and silicon oxide and an etch selectivity between the polysilicon material film and silicon nitride may be significantly increased.

Carrier

The carrier may be a suitable liquid capable of substantially uniformly dispersing the first and second organic polishing boosters. The carrier may be, e.g., an aqueous solvent or an organic solvent.

In an implementation, the carrier may include, e.g., water, deionized water (DIW), ultrapure water, alcohols (e.g., propenyl alcohol, isopropyl alcohol, ethanol, 1-propanol, methanol, or 1-hexanol), aldehydes (e.g., formaldehyde or acetaldehyde), esters (e.g., ethyl formate, propyl formate, ethyl acetate, methyl acetate, methyl lactate, butyl lactate, or ethyl lactate), ketones (e.g., acetone, diacetone alcohol, or methyl ethyl ketone), dimethyl sulfoxide (DMSO), tetrahydrofuran, dioxane, diglyme, amides (e.g., N,N-dimethyl formamide, dimethyl imidazolidinone, or N-methyl pyrrolidone), polyhydric alcohol and derivatives thereof (e.g., ethylene glycol, glycerol, diethylene glycol, or diethylene glycol monomethyl ether), nitrogen-containing organic compounds (e.g., acetonitrile, amylamine, isopropylamine, imidazole, or dimethyl amine), or a mixture thereof.

The amount of the carrier may be a residual or balance portion excluding the first and second organic polishing boosters and other components to be described below.

Inorganic Polishing Particles

In an implementation, the slurry composition for the CMP process may include inorganic polishing particles in an amount of less than about 0.01% by weight. The inorganic polishing particles may be suitable inorganic particles, which are widely used for a slurry composition for a CMP process. In an implementation, the slurry composition for the CMP process may include a metal oxide, e.g., silica, alumina, ceria, titania, zirconia, magnesia, germania, and mangania.

In an implementation, the slurry composition for the CMP process may include the inorganic polishing particles in an amount of, e.g., less than about 0.008% by weight, less than about 0.005% by weight, less than about 0.003% by weight, less than about 0.001% by weight, less than about 0.0008% by weight, less than about 0.0005% by weight, less than about 0.0003% by weight, less than about 0.0001% by weight, less than about 0.00008% by weight, less than about 0.00005% by weight, less than about 0.00003% by weight, or less than about 0.00001% by weight.

In an implementation, the slurry composition for the CMP process may not include inorganic polishing particles. In an implementation, the slurry composition for the CMP process may not include metal oxide particles. In an implementation, the slurry composition for the CMP process may not include any one of silica, alumina, ceria, titania, zirconia, magnesia, germania, and mangania. In an implementation, the slurry composition for the CMP process may be essentially free of inorganic polishing particles.

Here, when some particles are referred to as being 'not included,' it indicates that the particles are not intentionally added, but it does not indicate that the particles are not present at all or exist below a detection limit. Accordingly, the slurry composition for the CMP process may include the particles in an amount similar to that of unavoidable impurities.

Depending on polishing conditions, inorganic polishing particles included in some slurry compositions for a CMP process could damage a semiconductor device formed on a polishing object. For example, the inorganic polishing particles could damage layers, wirings, and patterns formed on the polishing object. Alternatively, even when a polishing process ends, the inorganic polishing particles may not be sufficiently removed and could cause contamination.

In addition, the inorganic polishing particles may reduce the lifespan of a polishing pad (refer to 10 in FIG. 1) used for a polishing process, and the inorganic polishing particles may become the cause of a replacement cost of the polishing pad 10 and an opportunity cost caused by a downtime for a replacement of the polishing pad 10.

According to an embodiment, when a plurality of organic polishing boosters are appropriately selected and combined, not only may a sufficient polishing rate be obtained without the need for inorganic polishing particles, but also a polishing selectivity may be rather improved. When the inorganic polishing particles are not included in the slurry composition for the CMP process, the damage to and contamination of a polishing object may be avoided, and the abrasion of the polishing pad may be reduced, thereby reducing manufacturing costs. In addition, the manufacturing costs may be further reduced in that the slurry composition itself for the CMP process becomes inexpensive.

In an implementation, the slurry composition for the CMP process may not include a dispersion stabilizer. The slurry composition for the CMP process may not include inorganic polishing particles as described above, and a dispersion stabilizer that could otherwise be added to obtain good dispersion of inorganic polishing particles may be unnecessary.

In an implementation, the slurry composition for the CMP process may not include, as the dispersion stabilizer, any one of ethylene oxide, ethylene glycol, glycol distearate, glycol monostearate, glycol polymerate, glycol ethers, alcohols containing alkylamine, compounds including polymerate ether, vinyl pyrrolidone, celluloses, and ethoxylate. In an implementation, the slurry composition for the CMP process may not include, as the dispersion stabilizer, any one of diethylene glycol hexadecyl ether, decaethylene glycol hexadecyl ether, diethylene glycol octadecyl ether, eicosaethylene glycol octadecyl ether, diethylene glycol oleyl ether, decaethylene glycol oleyl ether, decaethylene glycol octadecyl ether, nonylphenol polyethylene glycol ether, ethylenediamine tetrakis(ethoxylate-block-propoxylate) tetrol, ethylenediamine tetrakis(propoxylate-block-ethoxylate) tetrol, polyethylene-block-poly(ethylene glycol), polyoxyethylene isooctylphenyl ether, polyoxyethylene octylphenyl ether, polyoxyethylene tridecyl ether, polyoxyethylene sorbitan tetraoleate, polyoxyethylene sorbitol hexaoleate, polyethylene glycol sorbitan monolaurate, polyoxyethylene sorbitan monolaurate, sorbitan monopalmitate, FS-300 nonionic fluorosurfactant, FSN nonionic fluorosurfactant, FSO nonionic ethoxylated fluorosurfactant, vinyl pyrrolidone, 2,4,7,9-tetramethyl-5-decyne-4,7-diol ethoxylate, 8-methyl-1-nonanol propoxylate-block-ethoxylate, allyl alcohol 1,2-butoxylate-block-ethoxylate, polyoxyethylene branched nonylcyclohexyl ether, and polyoxyethylene isooctylcyclohexyl ether.

pH Control Agent

In an implementation, the slurry composition for the CMP process may further include a pH control agent for controlling a pH value of a composition. In an implementation, the slurry composition for the CMP process may have a pH value of, e.g., about 4 to about 11. In an implementation, the slurry composition for the CMP process may have a pH value of about 7 to about 11. In an implementation, the slurry composition for the CMP process may have a pH value of about 8 to about 11 or a pH value of about 9 to about 11.

To control a pH value of the slurry composition for the CMP process as desired, an acidic solution and an alkali solution may be appropriately used. In an implementation, the pH control agent may include, e.g., an acidic solution, such as sulfuric acid, phosphoric acid, hydrochloric acid, nitric acid, carboxylic acid, maleic acid, malonic acid, citric acid, oxalic acid, or tartaric acid, or an alkali solution, such as calcium hydroxide, potassium hydroxide, ammonium hydroxide, sodium hydroxide, magnesium hydroxide, triethylamine, tetra methyl ammonium hydroxide (TMAH), or ammonia. The pH control agent may be included in the slurry composition for the CMP process at such an amount that a pH value of the slurry composition for the CMP process is in a desired range.

Surfactant

In an implementation, the slurry composition for the CMP process may further include a surfactant as desired. Any one of a non-ionic surfactant, a cationic surfactant, an anionic surfactant, and an amphoteric surfactant may be appropriately selected and used as the surfactant.

The non-ionic surfactant may include, e.g., polyoxyethylene alkylethers such as polyoxyethylene laurylether or polyoxyethylene stearylether; polyoxyethylene alkylphenylethers such as polyoxyethylene octylphenylether or polyoxyethylene nonyl phenylether; sorbitan higher fatty acid esters such as sorbitan monolaurate, sorbitan monostearate, or sorbitan trioleate; polyoxyethylene sorbitan higher fatty acid esters such as polyoxyethylene sorbitan monolaurate; polyoxyethylene higher fatty acid esters such as polyoxyethylene monolaurate or polyoxyethylene monostearate; glycerine higher fatty acid esters such as oleic acid monoglyceride or stearic acid monoglyceride; polyoxyalkylenes such as polyoxyethylene, polyoxypropylene, or polyoxybutylene, or block copolymers thereof.

The cationic surfactant may include, e.g., alkyl trimethyl ammonium chloride, dialkyl dimethyl ammonium chloride, benzalkonium chloride, or alkyl dimethyl ammonium ethosulfate.

The anionic surfactant may include, e.g., carboxylic acid salts such as lauric acid sodium, oleic acid sodium, N-acyl-N-methylglycine sodium salts, or polyoxyethylene laurylether carboxylic acid sodium, sulfonates such as dodecylbenzene sulfonic acid sodium, dialkyl sulfosuccinate ester salts, or dimethyl-5-sulfoisophthalate sodium, ester sulfates such as sodium lauryl sulphate (SLS), sodium lauryl polyoxyethylene ether sulphate, or polyoxyethylene nonylphenyl ether sodium sulfate, or ester phosphates such as polyoxyethylene lauryl sodium phosphate, or polyoxyethylene nonylphenyl ether sodium phosphate.

The amphoteric surfactant may include, e.g., a carboxybetaine surfactant, aminocarboxylic acid salts, imedazolinium betaine, lecithin, or alkylamineoxide.

The surfactant may be included in an amount of about 0.001% by weight to about 0.5% by weight, based on a total weight of the slurry composition for the CMP process.

Leveling Agent

In an implementation, the slurry composition for the CMP process may further include a leveling agent for reducing irregularities of a polished surface as desired.

The leveling agent may include, e.g., ammonium chloride, ammonium lauryl sulfate (ALS), polyethylene glycol, polyoxyethylene alkyl ether sulfate (AES) triethylamine, polyvinylpyrrolidone (PVP), or polyacrolein.

The leveling agent may be included in an amount of about 0.1% by weight to about 1% by weight, based on a total weight of the slurry composition for the CMP process.

Oxidizer

In an implementation, the slurry composition for the CMP process may further include an oxidizer. The oxidizer may include, e.g., organic peroxides such as peracetic acid, perbenzoic acid, or tert-butyl hydroperoxide; permanganic acid compounds such as potassium permanganate; dichromic acid compounds such as potassium dichromate; halogenacid compounds such as potassium iodate; nitric acid compounds such as nitric acid or iron nitrate; perhalogenic acid compounds such as perchloric acid; persulfates such as sodium persulfate, potassium persulfate, or ammonium persulfate; percarbonates such as sodium percarbonate or potassium percarbonate; urea peroxide; or heteropolyacids.

Corrosion Inhibitor

In an implementation, the slurry composition for the CMP process may further include a corrosion inhibitor for protecting a surface to be polished from corrosion, as desired.

The corrosion inhibitor may include, e.g., triazole or derivatives thereof or benzene triazole or derivatives thereof. The triazole derivatives may include an amino-substituted triazole compound or a bi-amino-substituted triazole compound.

The corrosion inhibitor may be included in an amount of about 0.001% by weight to about 0.15% by weight, based on a total weight of the slurry composition for the CMP process. In an implementation, the corrosion inhibitor may be included in an amount of about 0.0025% by weight to about 0.1% by weight or about 0.005% by weight to about 0.05% by weight.

Biocide

In an implementation, the slurry composition for the CMP process may further include a biocide capable of preventing the propagation of microorganisms. The biocide may be a compound that inhibits, renders harmless, or exerts a control effect on any harmful organism by using chemical or biological methods.

In an implementation, the biocide may include, e.g., organo tin compounds, salicylanilide, mercaptan, a quaternary ammonium compound, hydrogen peroxide, sodium chloride, or sodium hypochlorite.

The biocide may be included in an amount of, e.g., about 0.001% to about 8% by weight, based on a total weight of the slurry composition for the CMP process. In an implementation, the biocide may be included in an amount of about 0.001% to about 8% by weight, about 0.002% to about 7% by weight, about 0.005% to about 6% by weight, about 0.008% to about 5% by weight, about 0.01% to about 4% by weight, about 0.02% to about 3% by weight, about 0.05% to about 2% by weight, about 0.1% to about 1% by weight, or any range between the values described above.

By using the above-described slurry composition for the CMP process, the polysilicon material film may be removed at a high polishing selectivity with respect to a silicon oxide film, a silicon nitride film, a silicon carbide film, and a silicon carbonitride (SiCN) film. In an implementation, a polishing selectivity of the polysilicon material with respect to the silicon oxide film, the silicon nitride film, the silicon carbide film, or the silicon carbonitride film may be in a range of, e.g., about 100 to about 2,000, about 105 to about 1,950, about 110 to about 1,900, about 115 to about 1,850, about 120 to about 1,800, about 125 to about 1,750, about 130 to about 1,700, about 135 to about 1,650, about 140 to about 1,600, about 145 to about 1,550, about 150 to about 1,500, or any range between the values described above.

Here, the polishing selectivity may be defined as a ratio B/A of a removed thickness B of the polysilicon material film to a removed thickness A of the silicon oxide film, the silicon nitride film, the silicon carbide film, or the silicon carbonitride film during a unit time.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Experimental Example 1

A slurry composition for a CMP process, which included a polymer having a structure of Formula 1 and a weight-averaged molecular weight of 55,000 as a first organic polishing booster in an amount of 100 ppm by weight, glycine as a second organic polishing booster in an amount of 10,000 ppm by weight, and DIW as a carrier, was prepared. A pH value of the slurry composition was adjusted to 11 by using potassium hydroxide as a pH control agent.

Experimental Example 2

A slurry composition for a CMP process was prepared in the same manner as in Experimental Example 1 except that the first organic polishing booster had a structure of Formula 2 (here, p=6 and q=3) and a weight-averaged molecular weight of 138,000.

Experimental Example 3

A slurry composition for a CMP process was prepared in the same manner as in Experimental Example 1 except that the first organic polishing booster had a structure of Formula 3 and a weight-averaged molecular weight of 46,000.

Experimental Example 4

A slurry composition for a CMP process was prepared in the same manner as in Experimental Example 1 except that the first organic polishing booster had a structure of Formula 3 and a weight-averaged molecular weight of 36,000.

Experimental Example 5

A slurry composition for a CMP process was prepared in the same manner as in Experimental Example 1 except that the first organic polishing booster had a structure of Formula 4 (here, p=4) and a weight-averaged molecular weight of 172,000.

Experimental Example 6

A slurry composition for a CMP process was prepared in the same manner as in Experimental Example 1 except that the first organic polishing booster had a structure of Formula 5 (here, x=2) and a weight-averaged molecular weight of 78,000.

Experimental Example 7

A slurry composition for a CMP process was prepared in the same manner as in Experimental Example 1 except that a first organic polishing booster had a structure of Formula 6 (here, x=2) and a weight-averaged molecular weight of 61,000.

Comparative Example 1

A slurry composition for a CMP process, which included colloidal silica particles with a diameter of about 80 nm to about 100 nm in an amount of about 3% by weight and DIW as a carrier, was prepared. A pH value of the slurry composition was adjusted to 11 by using potassium hydroxide as a pH control agent.

A polysilicon layer, a silicon oxide layer, and a silicon nitride layer were polished using the slurry compositions for the CMP process, according to Experimental Example 1 and Comparative Example 1. A polishing pressure was adjusted to 3 psi, rotation rates of a platen and a carrier head were adjusted to 100 rpm and 101 rpm, respectively, and a flow rate of each of the slurry compositions for the CMP process was adjusted to 250 ml/min. Thicknesses of each of the polysilicon layer, the silicon oxide layer, and the silicon nitride layer before and after a polishing process were measured, and polishing rates were calculated as shown in Table 1.

TABLE 1

|  | polysilicon | Si oxide | poly v. Si oxide selectivity | Si nitride | poly v. Si nitride selectivity |
|---|---|---|---|---|---|
| Experimental Example 1 | 4,700 Å/min | 30 Å/min | 157:1 | 10 Å/min | 470:1 |
| Experimental Example 2 | 4,430 Å/min | 38 Å/min | 117:1 | 21 Å/min | 211:1 |
| Experimental Example 3 | 5,150 Å/min | 42 Å/min | 123:1 | 17 Å/min | 303:1 |
| Experimental Example 4 | 5,010 Å/min | 36 Å/min | 139:1 | 14 Å/min | 295:1 |
| Experimental Example 5 | 4,120 Å/min | 28 Å/min | 147:1 | 11 Å/min | 375:1 |
| Experimental Example 6 | 4,270 Å/min | 37 Å/min | 157:1 | 10 Å/min | 427:1 |

TABLE 1-continued

|  | polysilicon | Si oxide | poly v. Si oxide selectivity | Si nitride | poly v. Si nitride selectivity |
|---|---|---|---|---|---|
| Experimental Example 7 | 4,430 Å/min | 41 Å/min | 108:1 | 16 Å/min | 277:1 |
| Comparative Example 1 | 2,700 Å/min | 100 Å/min | 27:1 | 35 Å/min | 77:1 |

When the slurry composition of Experimental Example 1 is compared with the slurry composition of Comparative Example 1, it may be seen that a selectivity of polysilicon to silicon oxide was improved by 5.8 times (=157/27), and a selectivity of polysilicon to silicon nitride was improved by 6.1 times (=470/77).

Without being bound by a specific theory, when the slurry composition of Experimental Example 1 was used, the selectivity was significantly improved because the removal of polysilicon was accelerated due to a synergistic effect caused by a combination of the first organic polishing booster with the second organic polishing booster, and the removal of silicon oxide or silicon nitride was delayed because no polishing agent was included.

The number of scratches per unit area was measured on a surface polished using each of the slurry compositions of Experimental Example 1 and Comparative Example 1. When the number of scratches on the surface polished using the slurry composition of Comparative Example 1 was set to 1, the number of scratches on the surface polished using the slurry composition of Experimental Example 1 was 0.07, which was improved by about 14 times (=1/0.07).

Figure 4:
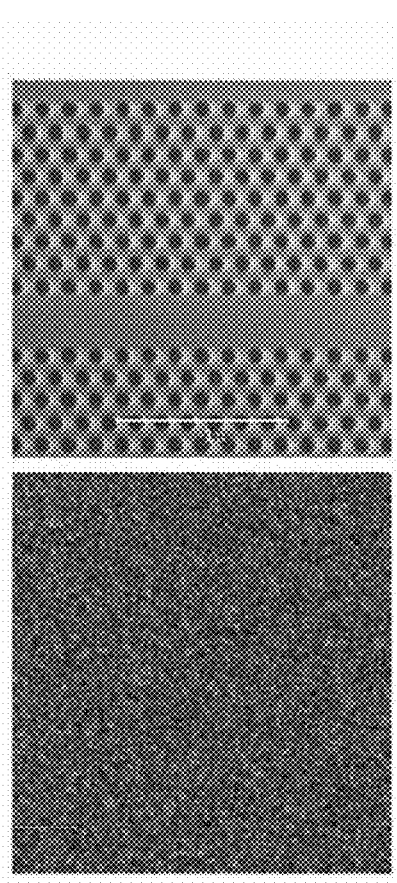
FIG. 4 is a scanning electron microscope (SEM) image showing a surface polished using a slurry composition of Experimental Example 1.
Figure 5:
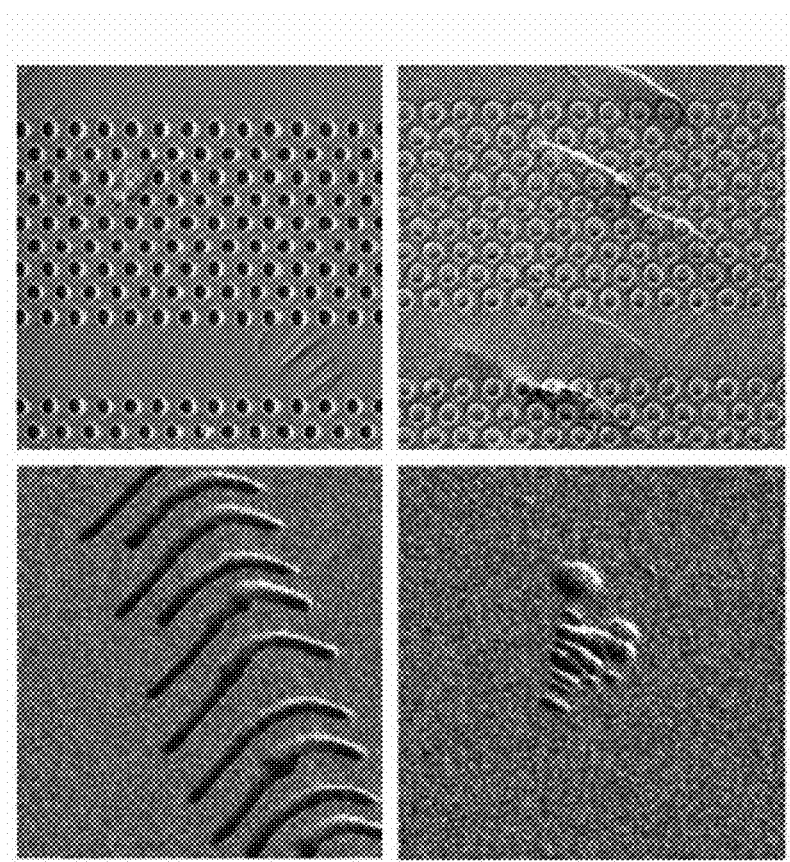
FIG. 5 is a SEM image showing a surface polished using a slurry composition of Comparative Example 1.

FIG. 4 is a scanning electron microscope (SEM) image of a surface polished using the slurry composition of Experimental Example 1, and FIG. 5 is a SEM image of a surface polished using the slurry composition of Comparative Example 1.

Referring to the SEM image of FIG. 4, no scratches are observed at all. However, referring to the SEM image of FIG. 5, a large number of scratches were observed.

Comparative Example 2

A slurry composition for a CMP process was prepared in the same manner as in Experimental Example 1 except that the second organic polishing booster was omitted.

A removal rate of a polysilicon material film was measured by using the slurry composition of Experimental example 1 and the slurry composition of Comparative Example 2. When the slurry composition of Experimental Example 1 was used, the removal rate of the polysilicon material film was about 9,542 A/min. However, when the slurry composition of Comparative Example 2 was used, the removal rate of the polysilicon material film was only about 2 A/min. This may be because a native oxide film was on a surface of the polysilicon material film, and hindered a polishing operation of the slurry composition of Comparative Example 2.

To evaluate the result, the surface of the polysilicon material film was treated with hydrofluoric acid and then polished with the slurry composition of Comparative Example 2, and the removal rate of the polysilicon material film was measured. As a result, a polishing rate of about 9,072 Å/min was obtained. It may be inferred that the native oxide film was removed by the hydrofluoric acid, and the polysilicon material film was removed by the slurry composition of Comparative Example 2, which was supplied after the native oxide film was removed.

Hereinafter, a method of manufacturing a semiconductor device by using the above-described slurry composition for the CMP process will be described.

FIGS. 2A to 2M are side cross-sectional views of stages in a method of manufacturing a semiconductor device 100, according to embodiments.

Figure 2A:
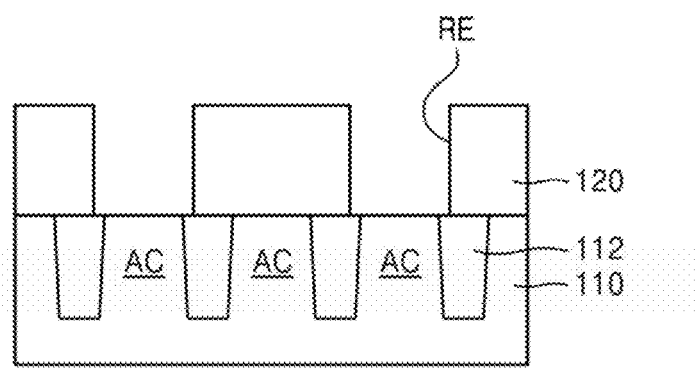
FIGS. 2A to 2M are side cross-sectional views of stages in a method of manufacturing a semiconductor device, according to embodiments.

Referring to FIG. 2A, an interlayer insulating film 120 may be formed on a substrate 110 including a plurality of active regions AC and patterned to expose at least portions of the plurality of active regions AC. The interlayer insulating film 120 may include recess portions RE exposing the active regions AC. The recess portions RE may be contact holes or trenches. In an implementation, the recess portions RE may be contact holes. In an implementation, the recess portions RE may be trenches.

The substrate 110 may include a semiconductor (e.g., silicon (Si) or germanium (Ge)) or a compound semiconductor (e.g., silicon germanium (SiGe), silicon carbide (SiC), gallium arsenide (GaAs), indium arsenide (InAs), or indium phosphide (InP)). In an implementation s, the substrate 110 may include a Group III-V material or a Group IV material. The Group III-V material may be a binary compound, a ternary compound, or a quaternary compound including a Group III atom and a Group V atom. The Group III-V material may be a compound including a Group III atom (e.g., In, Ga, or Al) and a Group V atom (e.g., arsenic (As), phosphorus (P), or antimony (Sb)). In an implementation, the Group III-V material may be, e.g., InP, $In_zGa_{1-z}As$ ($0 \leq z \leq 1$), or $Al_zGa_{1-z}As$ ($0 \leq z \leq 1$). The binary compound may be, e.g., InP, GaAs, InAs, InSb, or GaSb. The ternary compound may be, e.g., InGaP, InGaAs, AlInAs, InGaSb, GaAsSb, or GaAsP. The Group IV material may be silicon or germanium. In an implementation, the substrate 110 may have a silicon-on-insulator (SOI) structure. The substrate 110 may include a conductive region, e.g., a doped well or a doped structure.

The plurality of active regions AC may be defined by a plurality of device isolation regions 112 formed in the substrate 110. The device isolation regions 112 may include a silicon oxide film, a silicon nitride film, a silicon oxynitride film, or a combination thereof.

The interlayer insulating film 120 may include a silicon oxide film.

Figure 2B:
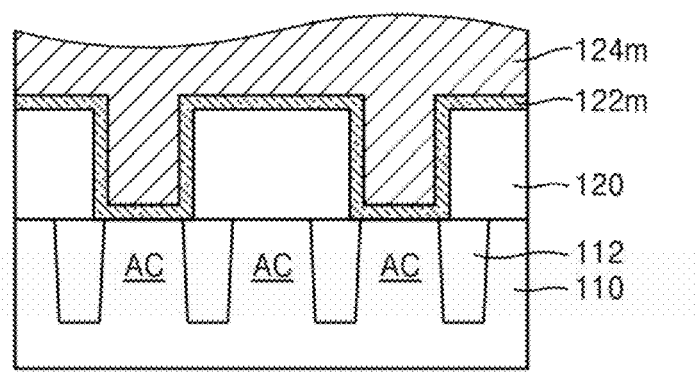

Referring to FIG. 2B, a barrier metal material layer 122m may be formed inside the recess portions RE and on the entire top surface of the interlayer insulating film 120. The barrier metal material layer 122m may be formed using an atomic layer deposition (ALD) process, a chemical vapor deposition (CVD) process, or a physical vapor deposition (PVD) process. The barrier metal material layer 122m may include, e.g., titanium (Ti) or titanium nitride (TiN).

In addition, a conductive material layer 124m may be formed on the entire top surface of the barrier metal material layer 122m. The conductive material layer 124m may include doped polysilicon or a metal, e.g., tungsten (W), and be formed using a CVD process.

Figure 2C:
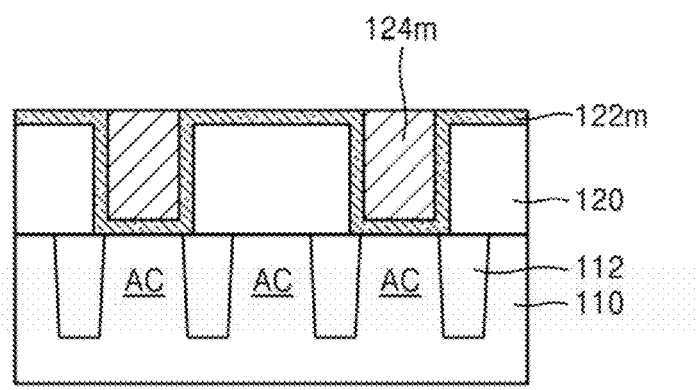

Referring to FIG. 2C, a CMP process may be performed on the conductive material layer 124m so that the conductive material layer 124m may be defined or remain inside the recess portions RE. In an implementation, a slurry composition for a CMP process, which has been described above, may be used. Inorganic polishing particles, e.g., silica, ceria, or alumina, may not be included in the slurry composition for the CMP process.

In this case, the CMP process may be performed using the barrier metal material layer 122m as a polishing stop film.

Figure 2D:
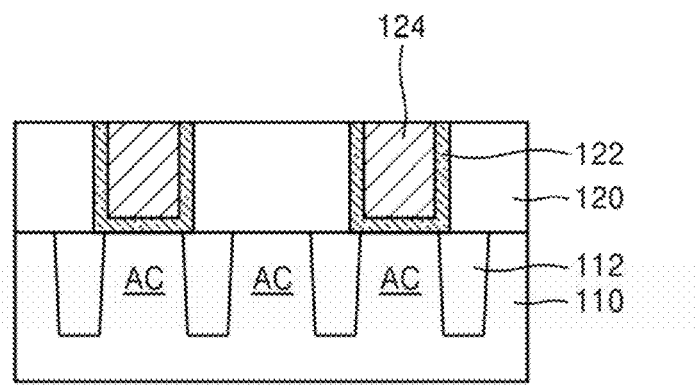

Referring to FIG. 2D, a CMP process may be performed on exposed portions of the barrier metal material layer 122m, forming a barrier metal layer 122 inside each of the contact holes and the contact holes may be completely node-separated from each other. In an implementation, a slurry composition for a CMP process, which has been described above, may be used.

The CMP process of FIG. 2D may be performed by using the slurry composition, which does not include inorganic polishing particles, in the same manner as described with reference to FIG. 2C.

FIGS. 2C and 2D illustrate an example in which two CMP processes are respectively performed by using the barrier metal layer 122 and the interlayer insulating film 120 as a polishing stop film. In an implementation, a single CMP process may be performed by using only the interlayer insulating film 120 as a polishing stop film.

In an implementation, the slurry composition for the CMP process may be controlled to have a pH value of about 4 to about 11. In an implementation, to remove a polysilicon material film more rapidly, a pH value of the slurry composition for the CMP process may be controlled to be a higher basic pH value. If the pH value of the slurry composition for the CMP process were to be less than 4, a polishing rate may be markedly reduced.

The plurality of conductive regions 124 may be connected to one of the terminals of switching devices (e.g., field-effect transistors (FETs)) formed on the substrate 110. In an implementation, the plurality of conductive regions 124 may include doped polysilicon, a metal, a conductive metal nitride, a metal silicide, or a combination thereof.

Figure 2E:
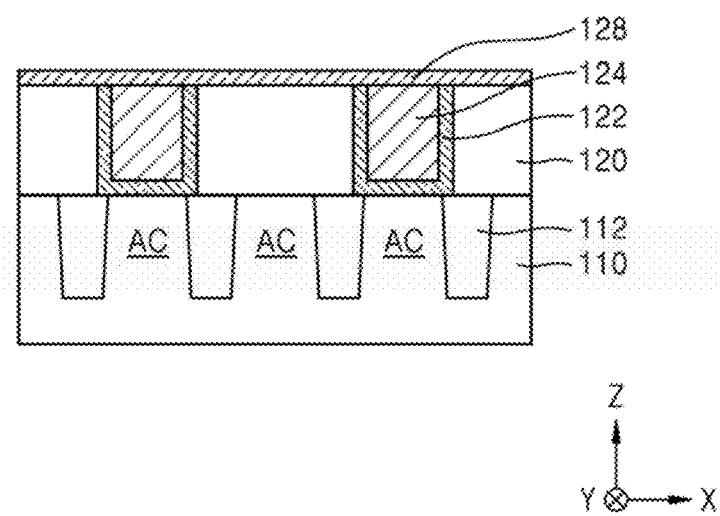

Referring to FIG. 2E, an insulating layer 128 may be formed to cover the interlayer insulating film 120 and the plurality of conductive regions 124. The insulating layer 128 may be used as an etch stop layer.

The insulating layer 128 may include an insulating material having an etch selectivity with respect to the interlayer insulating film 120 and a mold film (refer to 130 in FIG. 2F) that will be formed in a subsequent process. In an implementation, the insulating layer 128 may include silicon nitride, silicon oxynitride, or a combination thereof.

In an implementation, the insulating layer 128 may be formed to a thickness of, e.g., about 10 nm to about 60 nm.

Figure 2F:
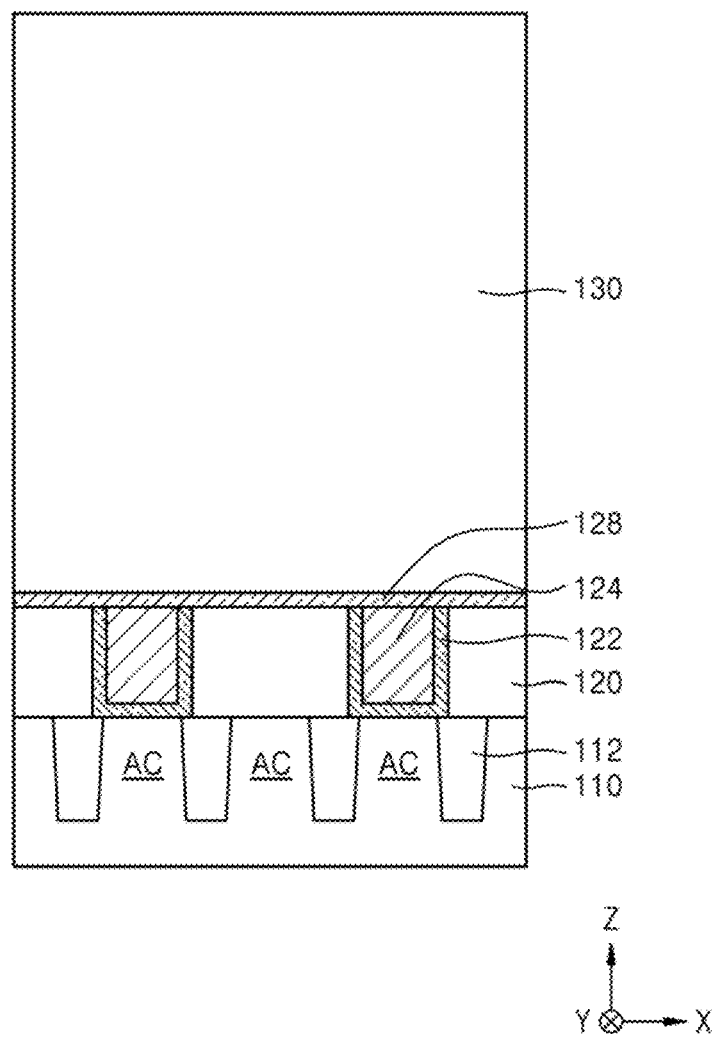

Referring to FIG. 2F, the mold film 130 may be formed on the insulating layer 128.

In an implementation, the mold film 130 may include an oxide film. In an implementation, the mold film 130 may include, e.g., an oxide film, such as a boro phospho silicate glass (BPSG) film, a phospho silicate glass (PSG) film, an undoped silicate glass (USG) film, a spin on dielectric (SOD) film, or an oxide film formed by using a high-density-plasma chemical vapor deposition (HDP CVD) process. The mold film 130 may be formed using a thermal CVD process or a plasma CVD process. In an implementation, the mold film 130 may be formed to a thickness of, e.g., about 100 nm to about 2,000 nm.

In an implementation, the mold film 130 may include a support film. The support film may include a material having an etch selectivity with respect to the mold film 130 and have a thickness of about 5 nm to about 300 nm. The support film may include a material having a relatively low etch rate with respect to an etching atmosphere (e.g., an etchant including ammonium fluoride ($NH_4F$), hydrofluoric acid (HF), and water), which is used when the mold film 130 is removed during a subsequent process. In an implementation, the support film may include, e.g., silicon nitride, silicon carbonitride, tantalum oxide, titanium oxide, or a combination thereof.

Figure 2G:
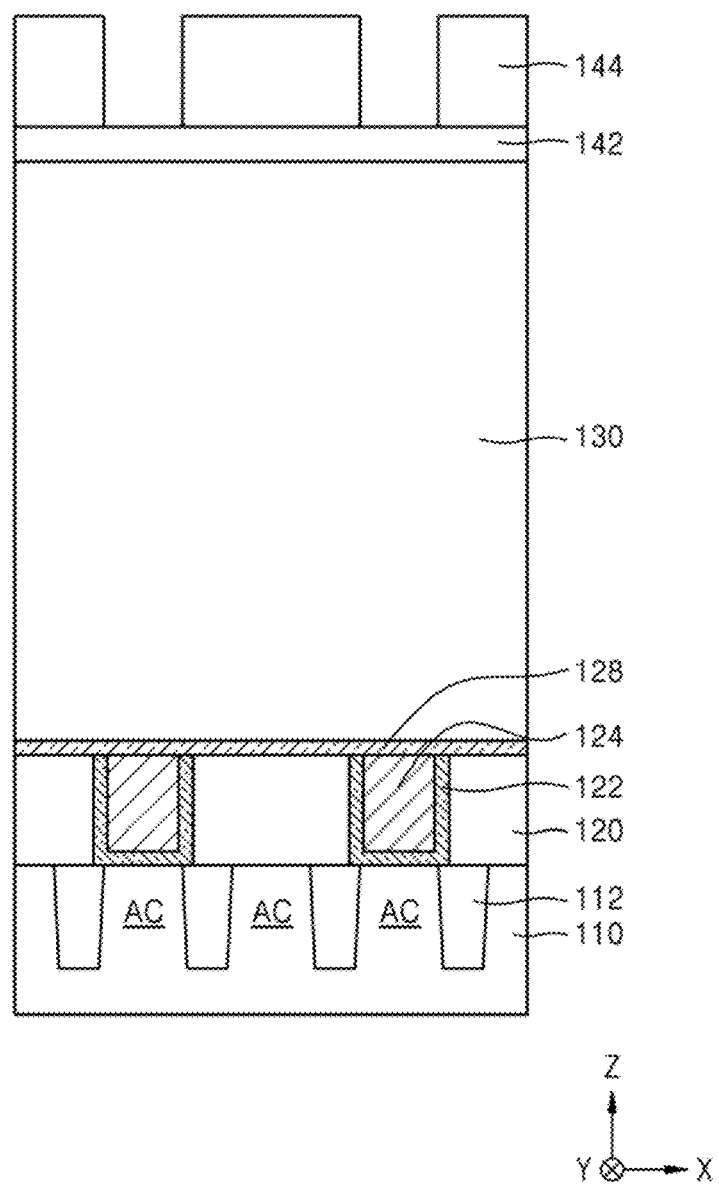

Referring to FIG. 2G, a sacrificial film 142 and a mask pattern 144 may be sequentially formed on the mold film 130.

The sacrificial film 142 may include an oxide film, such as a BPSG film, a PSG film, an USG film, an SOD film, or an oxide film formed by using an HDP CVD process. The sacrificial film 142 may have a thickness of about 50 nm to about 200 nm. The sacrificial film 142 may protect the support film included in the mold film 130.

The mask pattern 144 may include an oxide film, a nitride film, a polysilicon film, a photoresist film, or a combination thereof. A region where a lower electrode of a capacitor will be formed may be defined by the mask pattern 144.

Figure 2H:
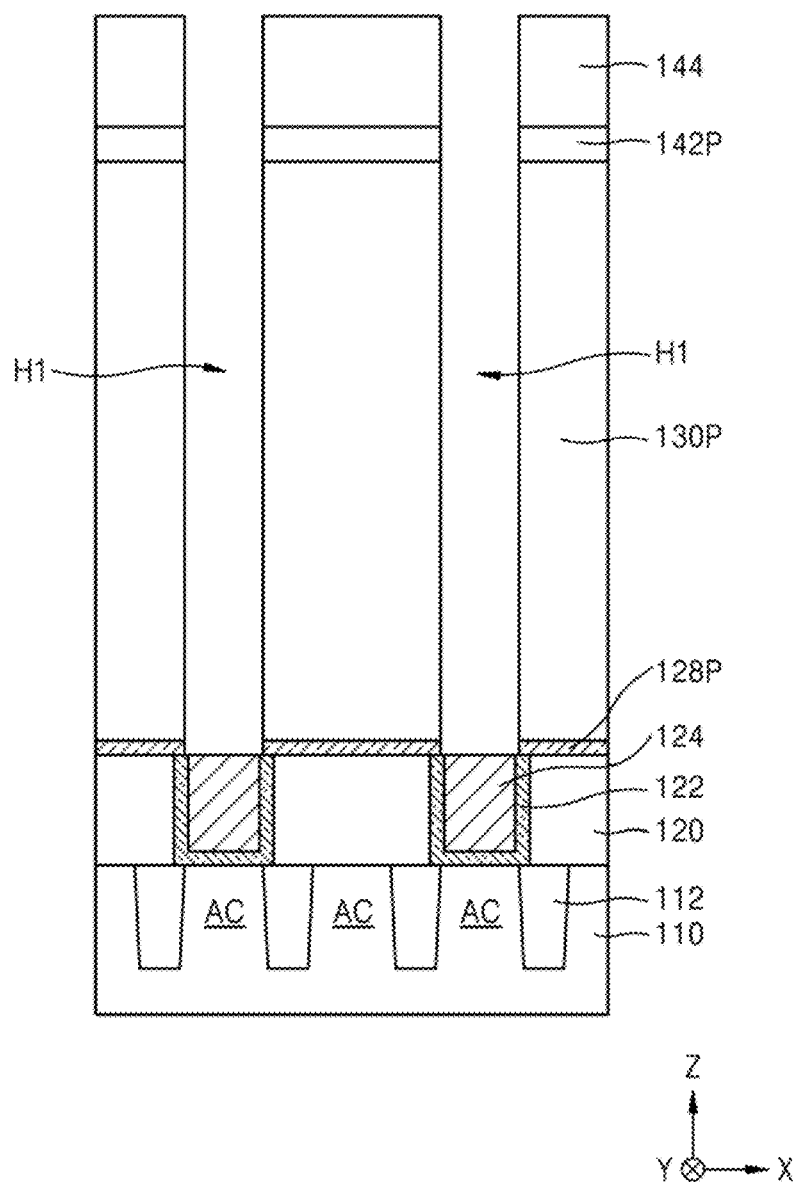

Referring to FIG. 2H, the sacrificial film 142 and the mold film 130 may be dry etched by using the mask pattern 144 as an etch mask and using the insulating layer 128 as an etch stop layer, thereby forming a sacrificial pattern 142P and a mold pattern 130P to define a plurality of holes H1.

In this case, the insulating layer 128 may also be etched due to excessive etching, thereby forming an insulating pattern 128P to expose a plurality of conductive regions 124.

Figure 2I:
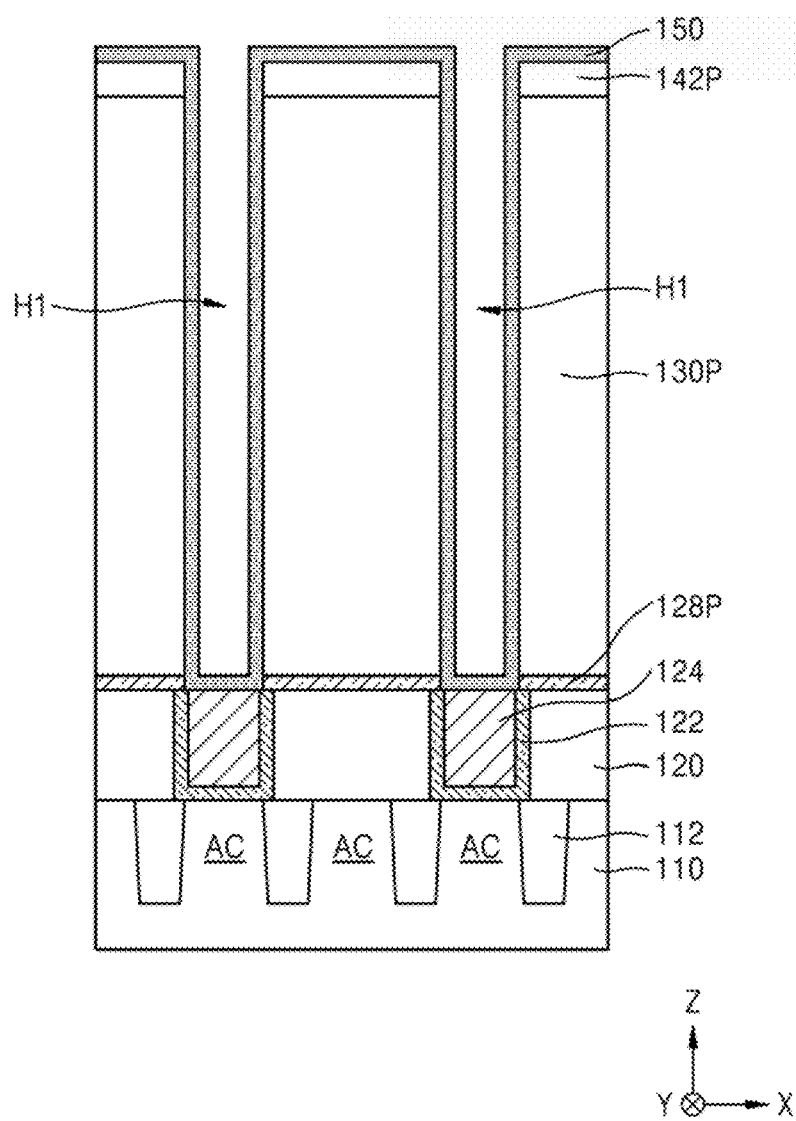

Referring to FIG. 2I, the mask pattern 144 may be removed from the resultant structure of FIG. 2H. Thereafter, a conductive film 150 for forming a lower electrode may be formed to cover an inner sidewall of each of the plurality of holes H1, an exposed surface of the insulating pattern 128P, surfaces of the plurality of conductive regions 124 respectively exposed inside the plurality of holes H1, and an exposed surface of the sacrificial pattern 142P.

The conductive film 150 for forming the lower electrode may be conformally formed on the inner sidewall of each of the plurality of holes H1 to leave a partial inner space of each of the plurality of holes H1.

In an implementation, the conductive film 150 for forming the lower electrode may include a doped semiconductor, a conductive metal nitride, a metal, a metal silicide, a conductive oxide, or a combination thereof. In an implementation, the conductive film 150 for forming the lower electrode may include, e.g., TiN, TiAlN, TaN, TaAlN, W, WN, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCo), or a combination thereof.

The conductive film 150 for forming the lower electrode may be formed by using a CVD process, a metal organic CVD (MOCVD) process, or an ALD process. In an implementation, the conductive film 150 for forming the lower electrode may be formed to a thickness of, e.g., about 1 nm to about 100 nm. In an implementation, a sacrificial film may be further formed to fill recess portions defined by the conductive film 150 for forming the lower electrode. The sacrificial film may cover a top surface of the conductive film 150 for forming the lower electrode.

Figure 2J:
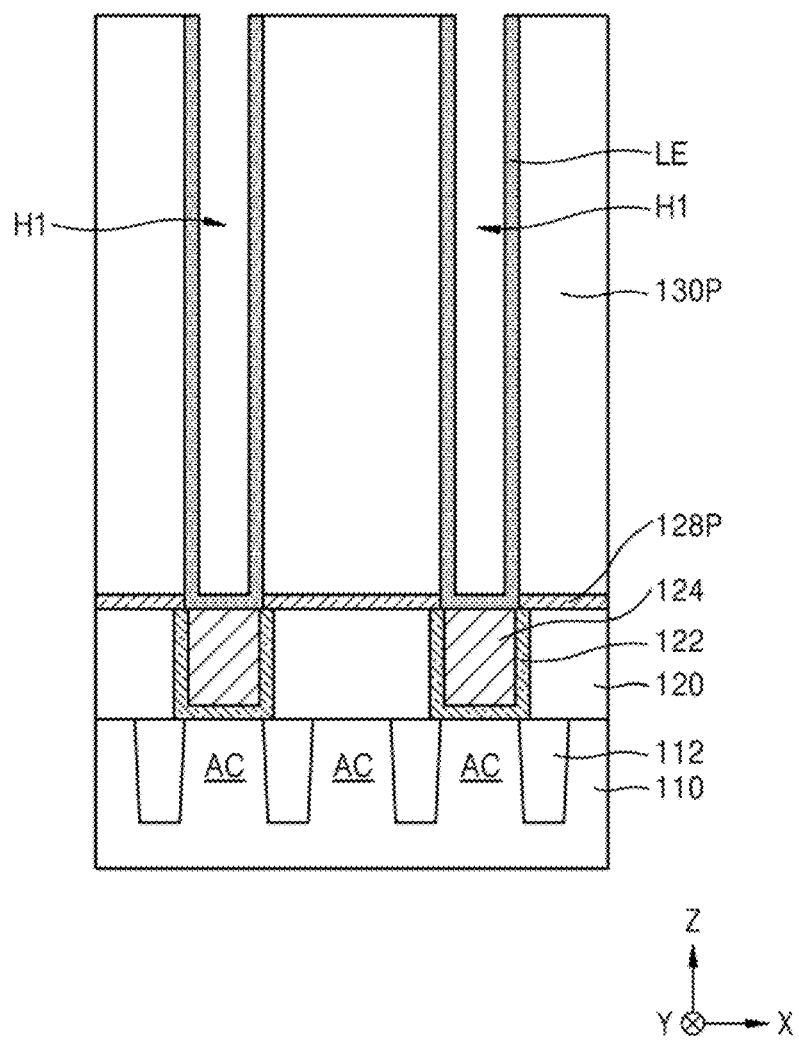

Referring to FIG. 2J, an upper portion of the conductive film 150 for forming the lower electrode may be partially removed so that the conductive film 150 for forming the lower electrode may be separated into a plurality of lower electrodes LE.

To form the plurality of lower electrodes LE, portions of the upper portion of the conductive film 150 for forming the lower electrode and the sacrificial pattern 142P (refer to FIG. 2I) may be removed by using an etchback process or a CMP process so that a top surface of the mold pattern 130P is exposed.

The plurality of lower electrodes LE may pass through the insulating pattern 128P and be connected to the conductive regions 124.

Figure 2K:
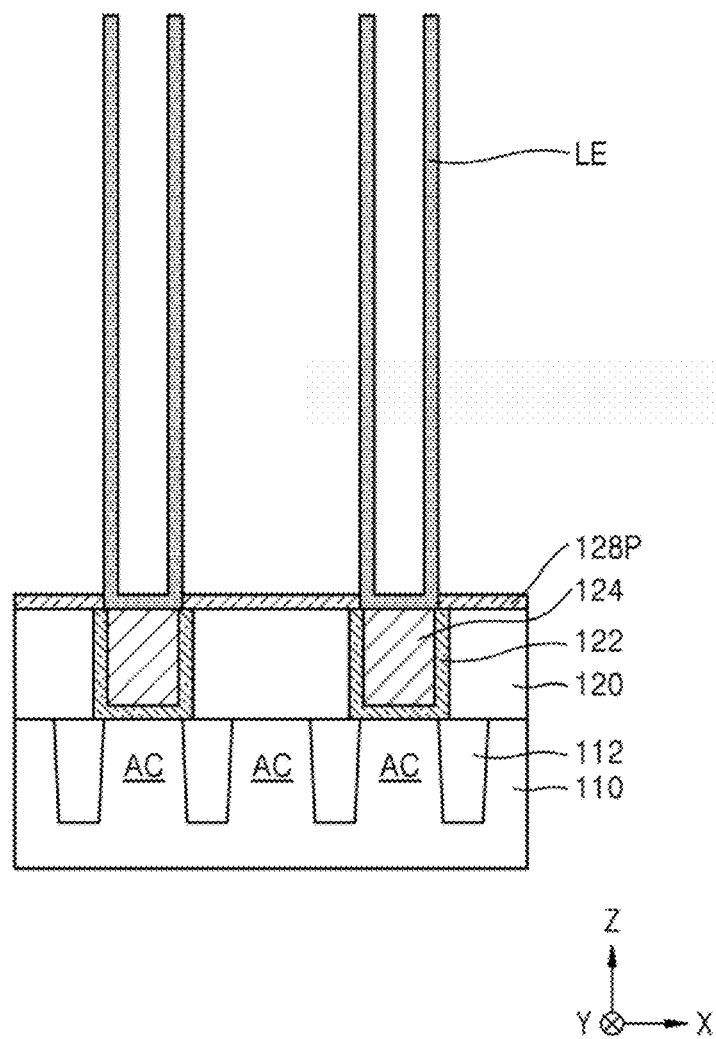

Referring to FIG. 2K, the mold pattern 130P may be removed to expose outer wall surfaces of the plurality of lower electrodes LE having cylindrical shapes.

The mold pattern 130P may be removed by a lift-off process using an etchant.

Figure 2L:
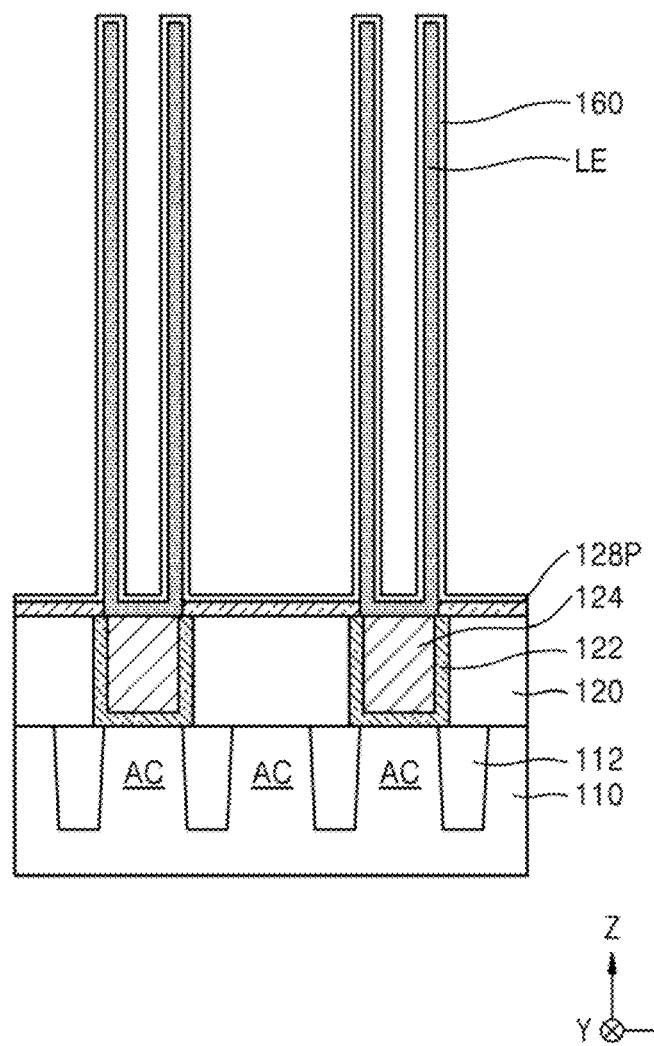

Referring to FIG. 2L, a dielectric film 160 may be formed on the plurality of lower electrodes LE.

The dielectric film 160 may be formed to conformally cover exposed surfaces of the plurality of lower electrodes LE.

The dielectric film 160 may be formed using an ALD process.

The dielectric film 160 may include an oxide, a metal oxide, a nitride, or a combination thereof. In an implementation, the dielectric film 160 may include a $ZrO_2$ film. In an implementation, the dielectric film 160 may include a single $ZrO_2$ layer or a multilayered structure including a combination of at least one $ZrO_2$ film and at least one $Al_2O_3$ film.

In an implementation, the dielectric film 160 may have a thickness of, e.g., about 5 nm to about 15 nm.

Figure 2M:
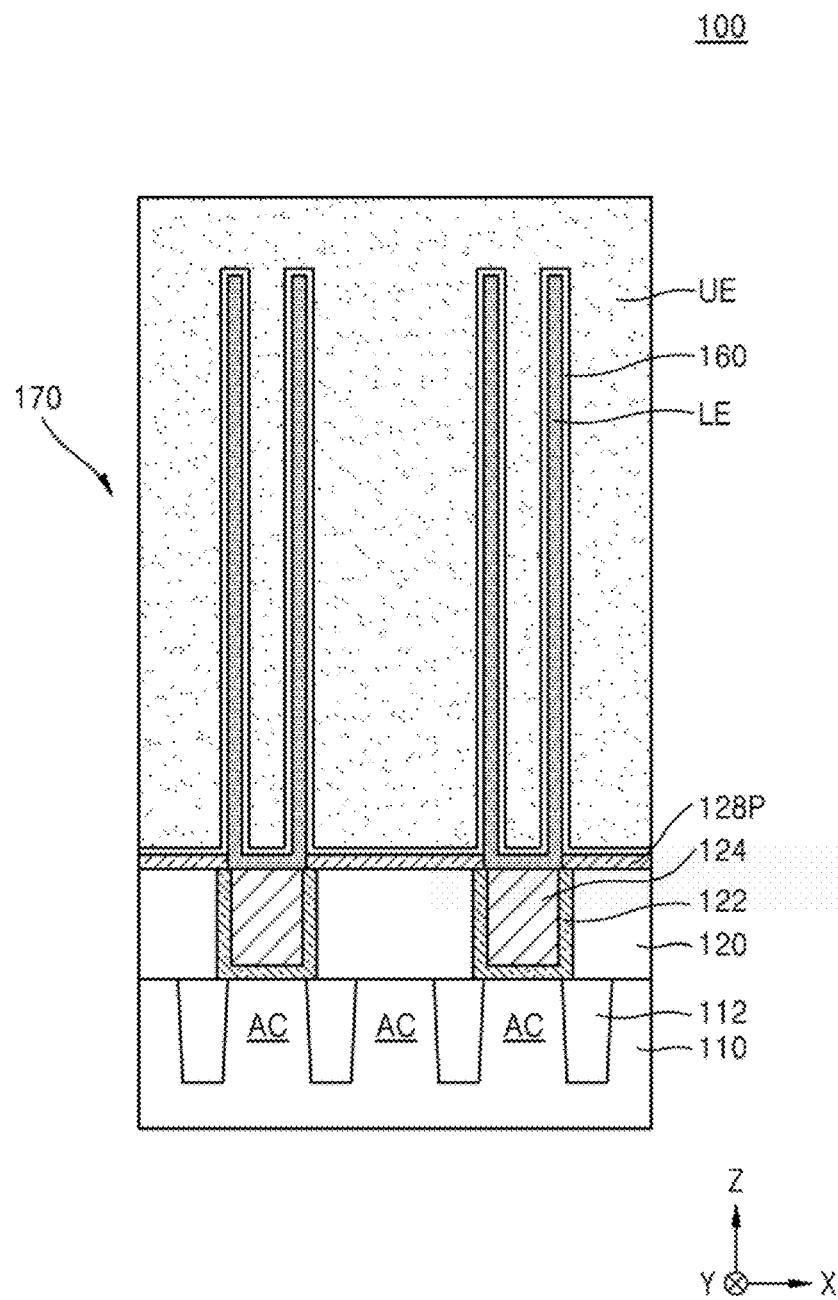

Referring to FIG. 2M, an upper electrode UE may be formed on the dielectric film 160.

A capacitor 170 may be configured by the lower electrode LE, the dielectric film 160, and the upper electrode UE.

The upper electrode UE may include a doped semiconductor, a conductive metal nitride, a metal, a metal silicide, a conductive oxide, or a combination thereof. In an implementation, the upper electrode UE may include, e.g., TiN, TiAlN, TaN, TaAlN, W, WN, Ru, $RuO_2$, $SrRuO_3$, Ir, $IrO_2$, Pt, PtO, $SrRuO_3$ (SRO), $(Ba,Sr)RuO_3$ (B SRO), $CaRuO_3$ (CRO), $(La,Sr)CoO_3$ (LSCo), or a combination thereof.

The upper electrode UE may be formed by using a CVD process, an MOCVD process, a physical vapor deposition (PVD) process, or an ALD process.

In an implementation, the method of manufacturing the semiconductor device 100 may include the process of forming the dielectric film 160 to cover the surfaces of the lower electrodes LE having cylindrical shapes. In an implementation, pillar-type lower electrodes having no inner spaces may be formed instead of the lower electrodes LE having cylindrical shapes. The dielectric film 160 may be formed on the pillar-type lower electrodes.

In the method of manufacturing the semiconductor device 100 according to the embodiment as described with reference to FIGS. 2A to 2M, a CMP process may be performed by using the slurry composition for the CMP process according to the embodiment to form the barrier metal layer 122 and the conductive regions 124. In an implementation, a CMP process using the slurry composition for the CMP process according to the embodiments may be applied to methods of manufacturing other semiconductor devices.

FIGS. 3A to 3K are side cross-sectional views of stages in a method of manufacturing a semiconductor device 200, according to embodiments.

Figure 3A:
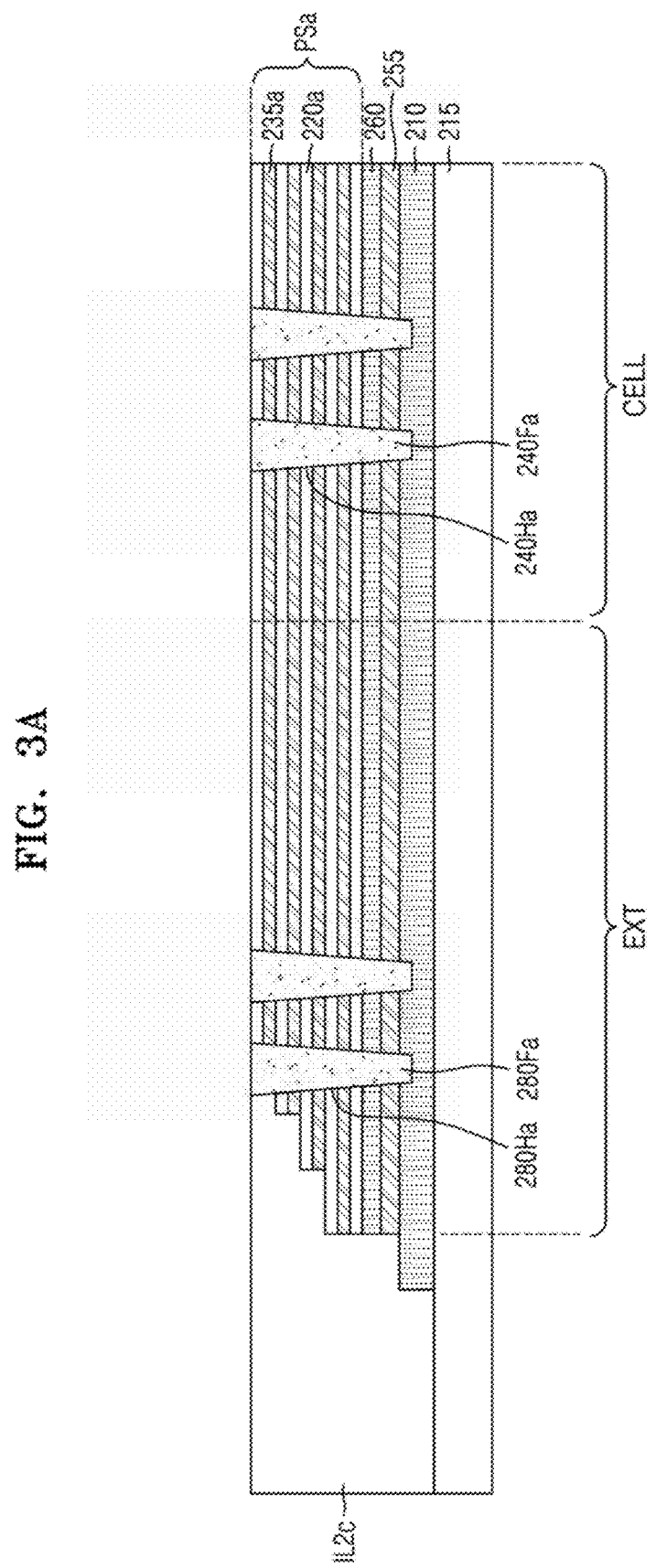
FIGS. 3A to 3K are side cross-sectional views of stages in a method of manufacturing a semiconductor device, according to embodiments.

Referring to FIG. 3A, a substrate 215 may be provided. The substrate 215 may include, e.g., a semiconductor material such as a Group IV semiconductor material, a Group III-V semiconductor material, or a Group II-VI semiconductor material. The common source line layer 210 may be formed on the substrate 215. A first portion PSa of a preliminary stack structure may be formed above the common source line layer 210. The first portion PSa of the preliminary stack structure may be formed by alternately forming a plurality of first interlayer insulating layers 220a and a plurality of first sacrificial layers 235a over the common source line layer 210. Each of the plurality of first sacrificial layers 235a may include a material having an etch selectivity with respect to each of the plurality of first interlayer insulating layers 220a. In an implementation, when the first interlayer insulating layer 220a includes silicon oxide, the first sacrificial layer 235a may include silicon nitride.

In an implementation, a lower sacrificial layer 255 may be further formed between the common source line layer 210 and the first portion PSa of the preliminary stack structure. In an implementation, a lower support layer 260 may be further formed between the lower sacrificial layer 255 and the first portion PSa of the preliminary stack structure. The lower sacrificial layer 255 may include a material having an etch selectivity with respect to the common source line layer 210 and the lower support layer 260. For example, when the common source line layer 210 and the lower support layer 260 include polysilicon, the lower sacrificial layer 255 may include silicon nitride.

The first portion PSa of preliminary stack structure may be patterned so that a step region EXT of the first portion PSa of the preliminary stack structure has a stepped shape. Next, a first portion IL2c of an insulating structure may be formed on the substrate 215 and the first portion PSa of the preliminary stack structure. Next, a first channel hole 240Ha passing through a cell region CELL of the first portion PSa of the preliminary stack structure and a first dummy channel hole 280Ha passing through the step region EXT of the first portion PSa of the preliminary stack structure may be formed. The first dummy channel hole 280Ha may further pass through the first portion IL2c of the insulating structure. The first channel hole 240Ha and the first dummy channel hole 280Ha may further pass through the lower support layer 260 and the lower sacrificial layer 255.

Next, the first channel hole 240Ha and the first dummy channel hole 280Ha are filled by a first filling layer 240Fa and a first dummy filling layer 280Fa, respectively. In an implementation, the first filling layer 240Fa and the first dummy filling layer 280Fa may include polysilicon.

To form the first filling layer 240Fa and the first dummy filling layer 280Fa, polysilicon may be formed not only inside the first channel hole 240Ha and the first dummy channel hole 280Ha but also on an uppermost one of the first interlayer insulating layers 220a. Thereafter, a CMP process may be performed by using an upper portion of the first interlayer insulating layer 220a as a polishing stop layer, and thus, polysilicon may be defined inside the first channel hole 240Ha and the first dummy channel hole 280Ha. By using the slurry composition according to the embodiment to perform the CMP process, polysilicon may be removed at a relatively high polishing selectivity while reducing defects.

Figure 3B:
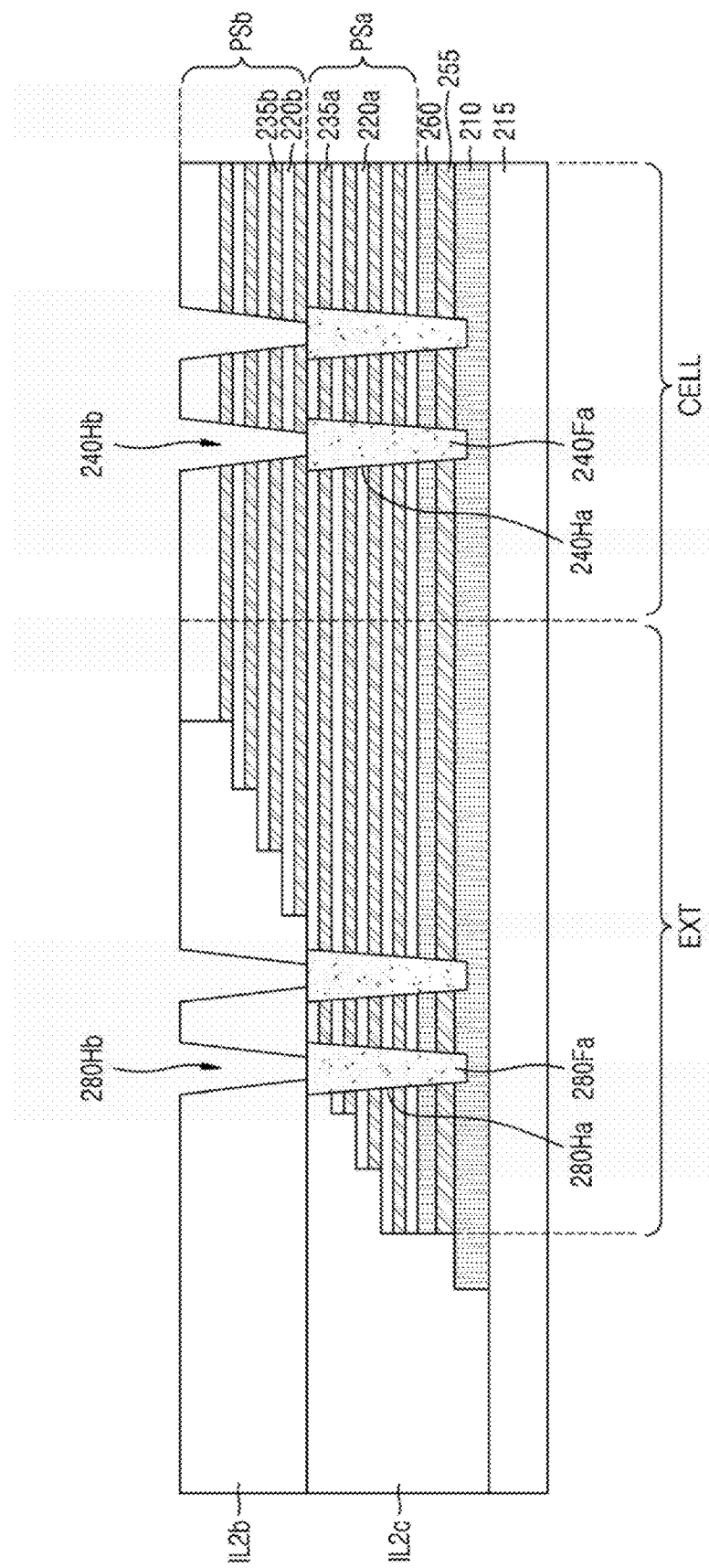

Referring to FIG. 3B, a second portion PSb of a preliminary stack structure may be formed on the first portion PSa of the preliminary stack structure. The second portion PSb of the preliminary stack structure may be formed by alternately forming the plurality of second interlayer insulating layers 220b and a plurality of second sacrificial layers 235b over the first portion PSa of the preliminary stack structure. Each of the plurality of second sacrificial layers 235b may include a material having an etch selectivity with respect to each of the plurality of second interlayer insulating layers 220b. In an implementation, when the second interlayer insulating layer 220b includes silicon oxide, the second sacrificial layer 235b may include silicon nitride.

The second portion PSb of preliminary stack structure may be patterned so that a step region EXT of the second portion PSb of the preliminary stack structure has a stepped shape. Next, a second portion IL2b of an insulating structure may be formed on the first portion IL2c of the insulating structure and the first portion PSa and the second portion PSb of the preliminary stack structure. Next, a second channel hole 240Hb passing through the second portion PSb of the preliminary stack structure and exposing the first filling layer 240Fa and a second dummy channel hole 280Hb passing through the second portion IL2b of the insulating structure and exposing the first dummy filling layer 280Fa may be formed.

Figure 3C:
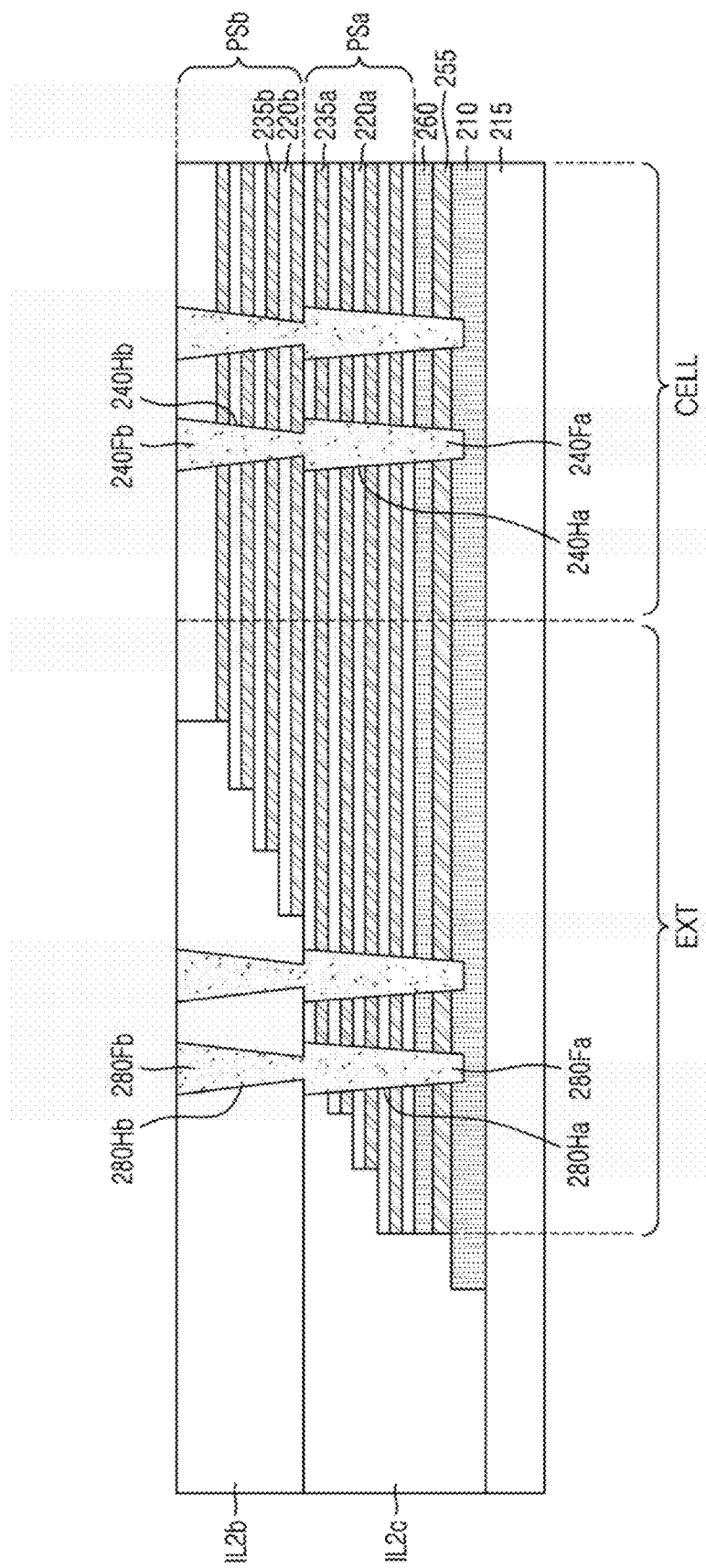

Referring to FIG. 3C, the second channel hole 240Hb and the second dummy channel hole 280Hb may be filled by a second filling layer 240Fb and a second dummy filling layer 280Fb, respectively. In an implementation, the second filling layer 240Fb and the second dummy filling layer 280Fb may include polysilicon.

To form the second filling layer 240Fb and the second dummy filling layer 280Fb, polysilicon may be formed not only inside the second channel hole 240Hb and the second dummy channel hole 280Hb but also on an uppermost layer of the second portion PSb. Thereafter, a CMP process may be performed by using the uppermost layer as a polishing stop film, and thus, polysilicon may be defined inside the second channel hole 240Hb and the second dummy channel hole 280Hb. By using the slurry composition according to the embodiment to perform the CMP process, polysilicon may be removed at a relatively high polishing selectivity while reducing defects.

Figure 3D:
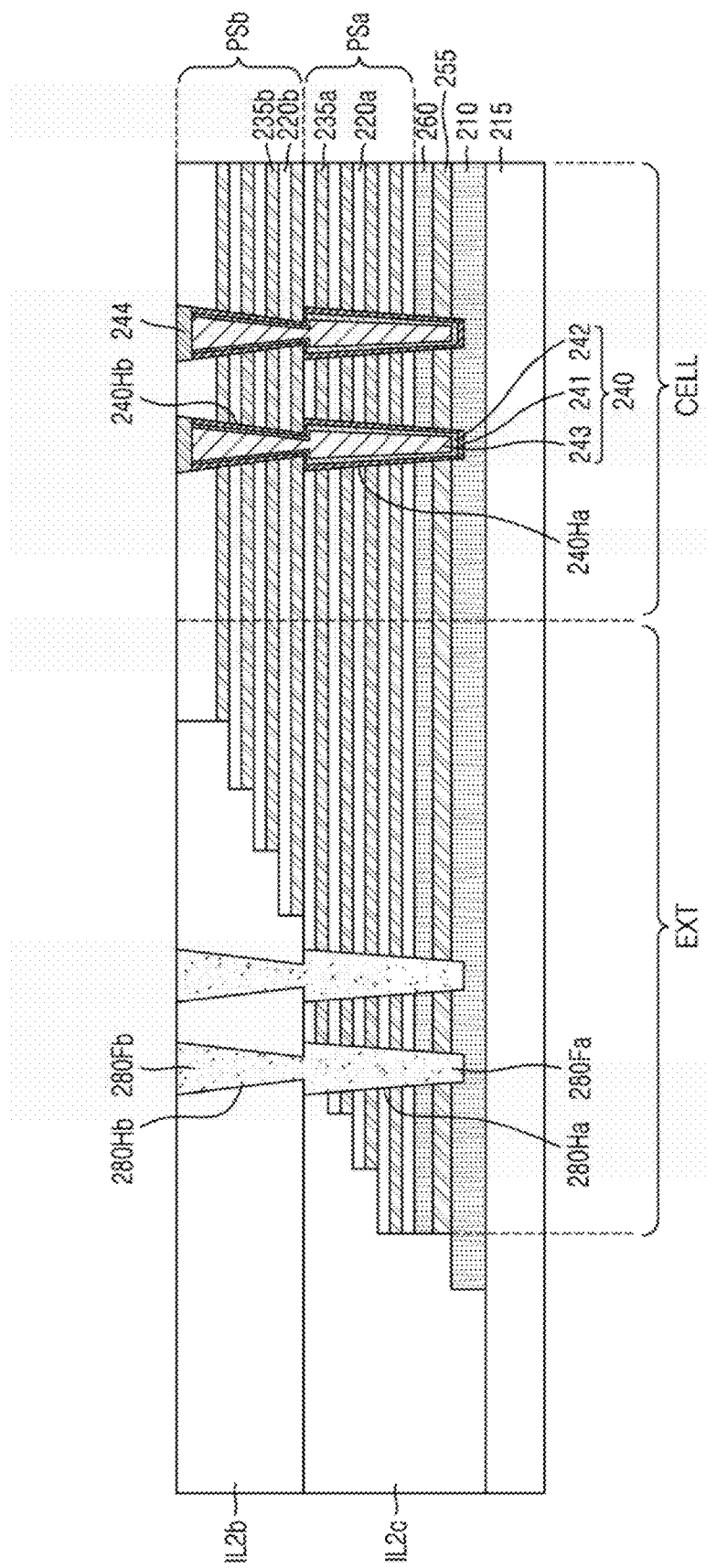

Referring to FIGS. 3C and 3D, the first filling layer 240Fa and the second filling layer 240Fb may be respectively removed from the first channel hole 240Ha and the second channel hole 240Hb. To help prevent the first dummy filling layer 280Fa and the second dummy filling layer 280Fb from being removed, a mask for covering the second dummy filling layer 280Fb and exposing the second filling layer 240Fb may be formed before the first filling layer 240Fa and the second filling layer 240Fb are removed. The mask may be removed after the first filling layer 240Fa and the second filling layer 240Fb are removed.

Next, a channel structure 240 may be formed inside the first channel hole 240Ha and the second channel hole 240Hb. A gate insulating layer 241 may be formed on the first channel hole 240Ha and the second channel hole 240Hb. In an implementation, the gate insulating layer 241 may be formed by sequentially forming a blocking insulating layer, a charge storage layer, and a tunneling insulating layer on the first channel hole 240Ha and the second channel hole 240Hb. A channel layer 242 may be formed on the gate insulating layer 241. A buried insulating layer 243 may be formed on the channel layer 242. The buried insulating layer 243 may fill the first channel hole 240Ha and the second channel hole 240Hb together with the gate insulating layer 241 and the channel layer 242 to form the channel structure 240. Next, portions of the gate insulating layer 241, the channel layer 242, and the buried insulating layer 243 inside an end portion of the second channel hole 240Hb may be removed, and a channel pad 244 may be formed inside the end portion of the second channel hole 240Hb.

Figure 3E:
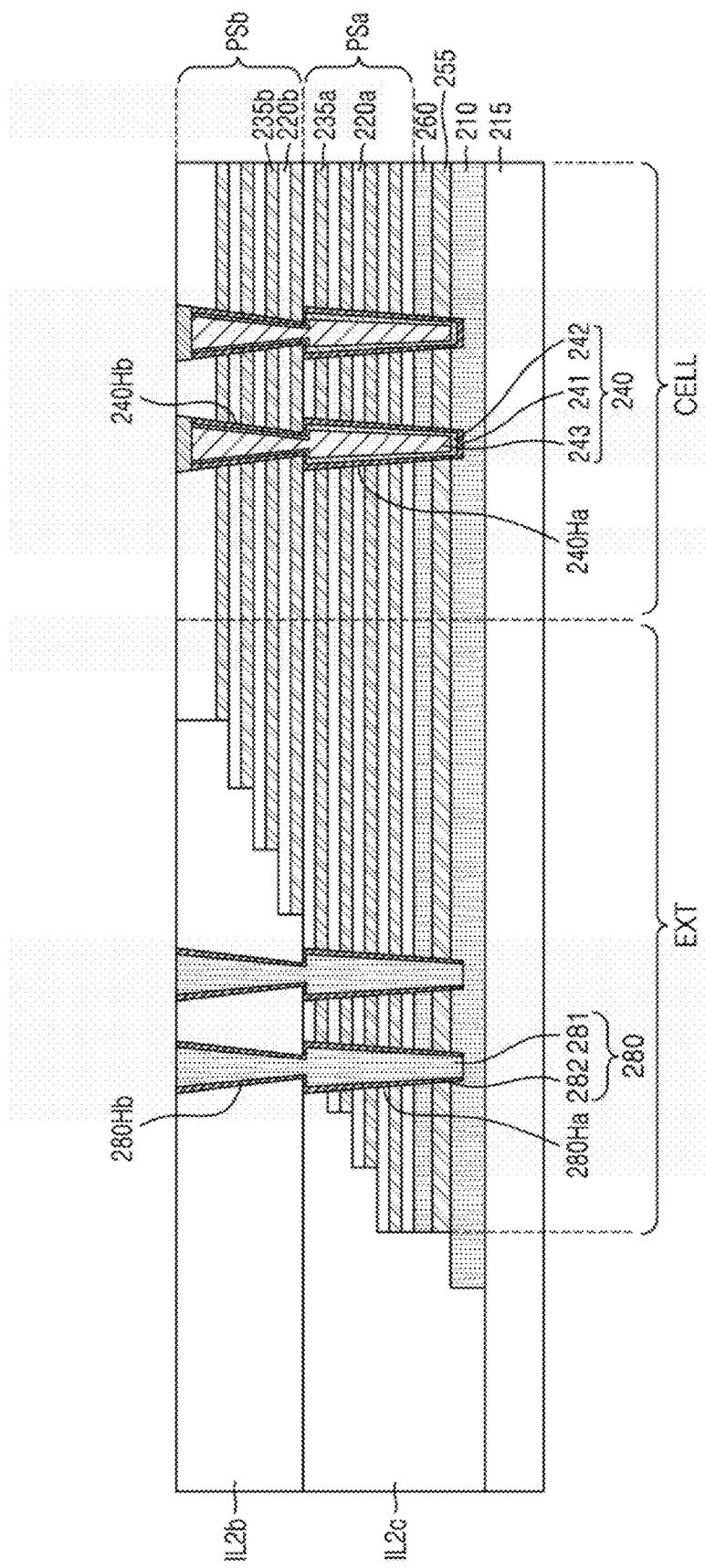

Referring to FIGS. 3D and 3E, the first dummy filling layer 280Fa and the second dummy filling layer 280Fb may be removed from the first dummy channel hole 280Ha and the second dummy channel hole 280Hb. In some embodiments, to prevent the channel structure 240 from being removed, a mask for covering the channel structure 240 and exposing the second dummy filling layer 280Fb may be formed before the first dummy filling layer 280Fa and the second dummy filling layer 280Fb are removed. The mask may be removed after the first dummy filling layer 280Fa and the second dummy filling layer 280Fb are removed.

Next, a dummy channel structure 280 may be formed inside the first dummy channel hole 280Ha and the second dummy channel hole 280Hb. First, an insulating layer 282 may be formed on sidewalls of the first dummy channel hole 280Ha and the second dummy channel hole 280Hb. In an implementation, the insulating layer 282 may be formed on a top surface of the second portion IL2b of the second insulating structure, sidewalls of the second dummy channel hole 280Hb, and sidewalls and the bottom of the first dummy channel hole 280Ha, and the insulating layer 282 on the top surface of the second portion IL2b of the second insulating structure and the bottom of the first dummy channel hole 280Ha may be removed by anisotropically etching the insulating layer 282. Next, a conductive layer 281 may be formed on the insulating layer 282. The conductive layer 281 may fill the first dummy channel hole 280Ha and the second dummy channel hole 280Hb together with the insulating layer 282.

Figure 3F:
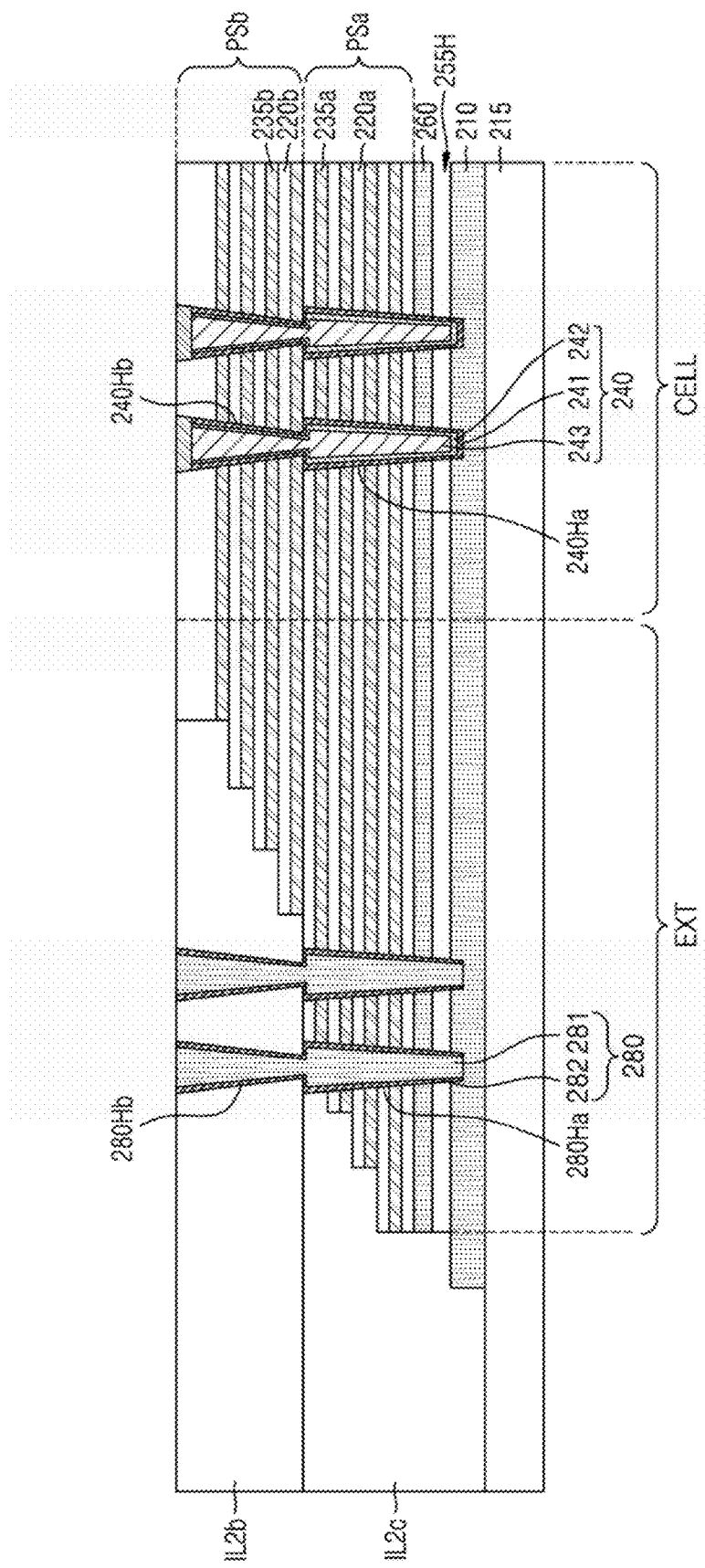

Referring to FIGS. 3E and 3F, a space 255H may be formed between the common source line layer 210 and the lower support layer 260 by removing the lower sacrificial layer 255. The gate insulating layer 241 of the channel structure 240 and the insulating layer 282 of the dummy channel structure 280 may be exposed in the space 255H. To remove the lower sacrificial layer 255, although not shown in FIGS. 3E and 3F, a word line cut passing through the preliminary stack structure (e.g., the first and second portions PSa and PSb) and the lower support layer 260 and exposing the lower sacrificial layer 255 may be formed before the lower sacrificial layer 255 is removed. An etchant may reach the lower sacrificial layer 255 through the word line cut and etch the lower sacrificial layer 255.

Figure 3G:
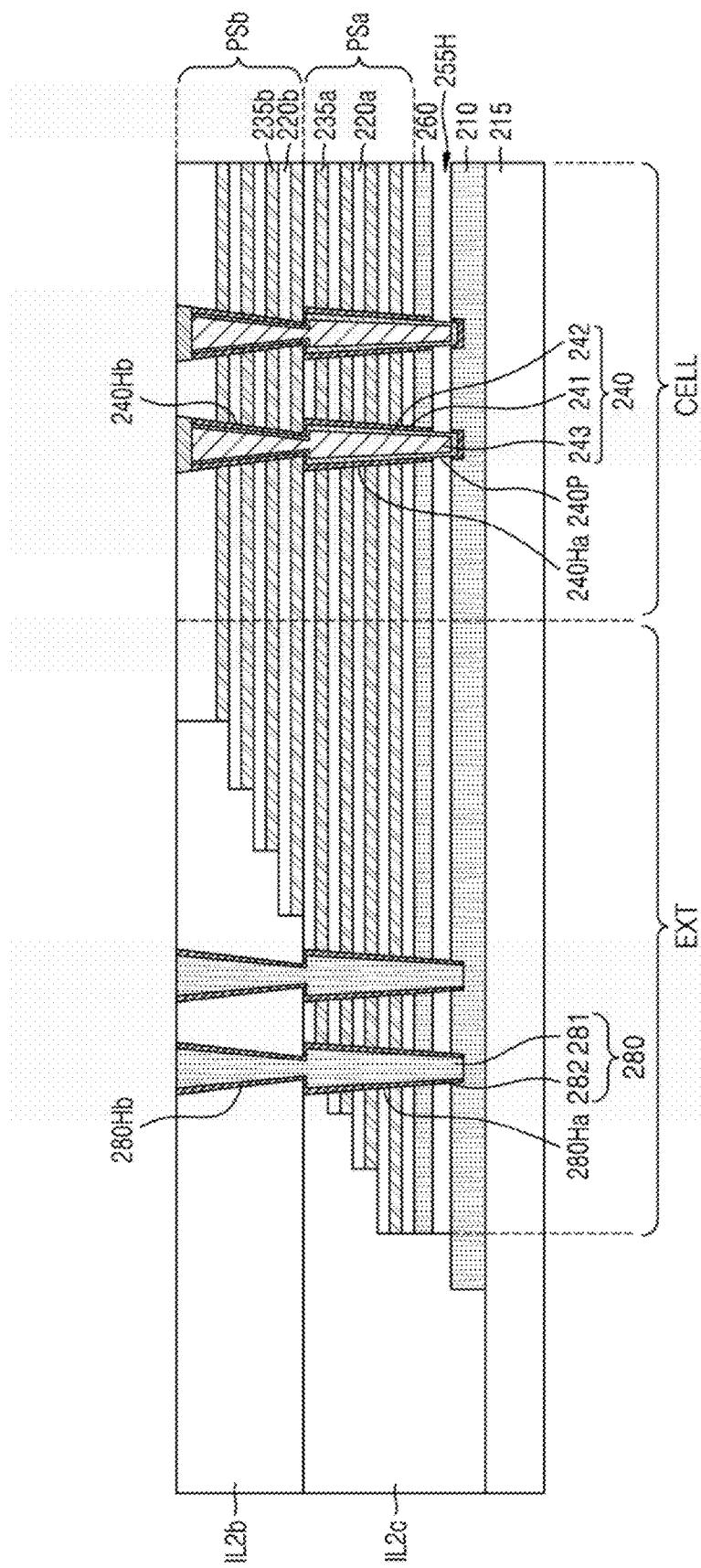

Referring to FIGS. 3F and 3G, an opening 240P passing through the gate insulating layer 241 may be formed by removing a portion of the gate insulating layer 241 of the channel structure 240 exposed in the space 255H. The channel layer 242 may be exposed in the space 255H through the opening 240P. In an implementation, the insulating layer 282 of the dummy channel structure 280 is sufficiently thick, and thus, even when the insulating layer 282 of the dummy channel structure 280 is exposed to an etchant for removing a portion of the gate insulating layer 241 of the channel structure 240, the conductive layer 281 may not be exposed in the space 255H. In an implementation, the insulating layer 282 of the dummy channel structure 280 may be exposed to an etchant for removing a portion of the gate insulating layer 241 of the channel structure 240, and thus, an exposed portion of the insulating layer 282 may be etched to expose the conductive layer 281 in the space 255H.

Figure 3H:
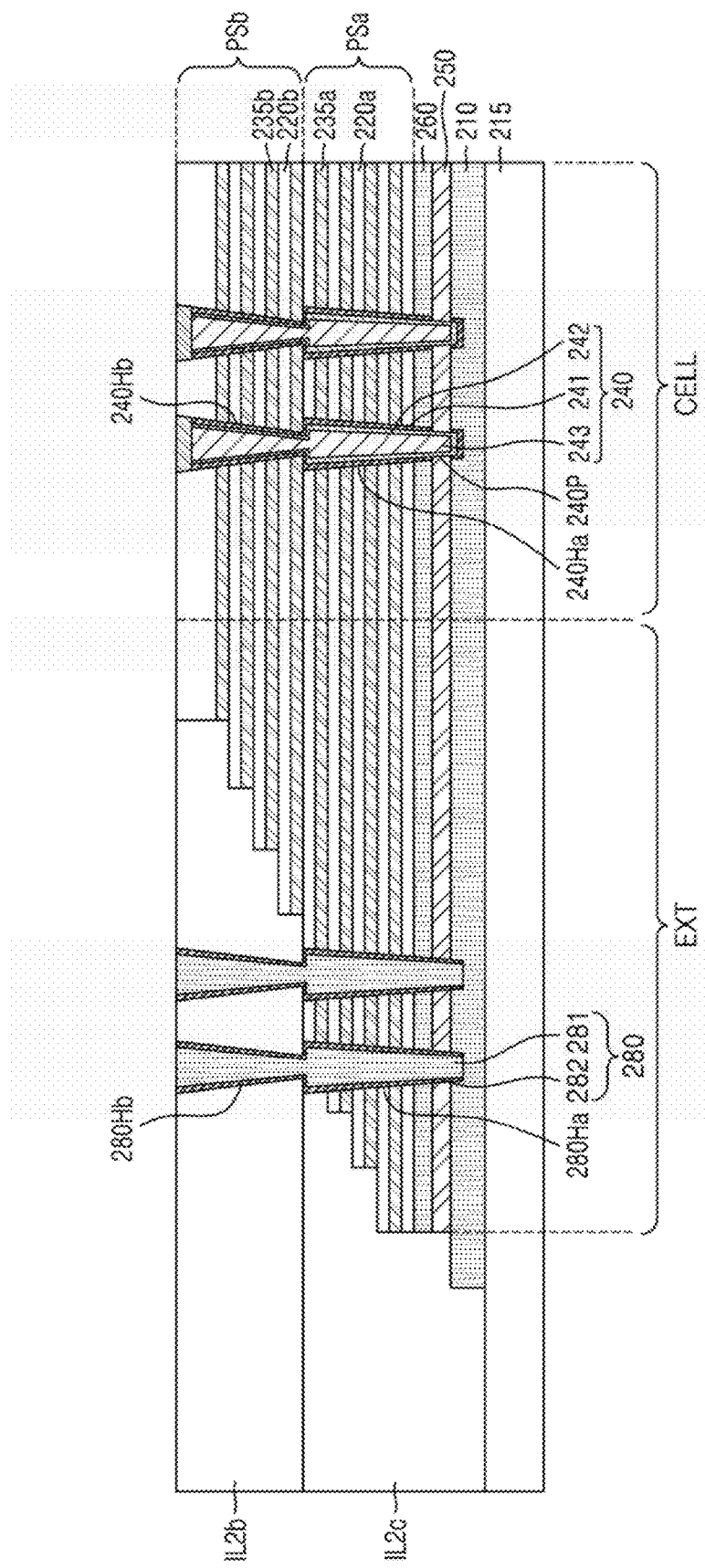

Referring to FIGS. 3G and 3H, the lower conductive layer 250 may be formed in the space 255H. The lower conductive layer 250 may contact the channel layer 242 through the opening 240P. In an implementation, the lower conductive layer 250 may not contact the conductive layer 281. In an implementation, the lower conductive layer 250 may pass through the insulating layer 282 and contact the conductive layer 281.

Figure 3I:
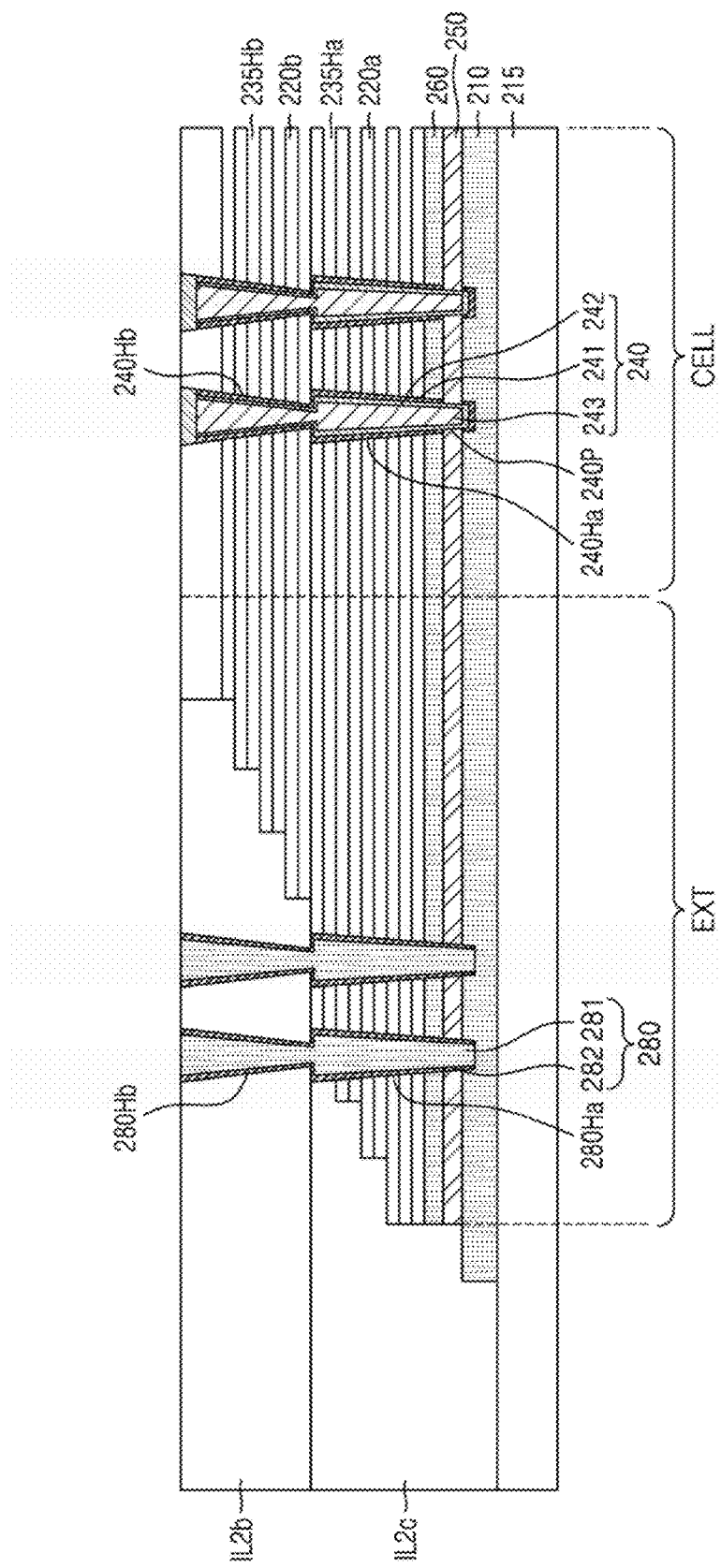

Referring to FIGS. 3H and 3I, a plurality of spaces 235Ha and 235Hb may be formed between the plurality of first and second interlayer insulating layers 220a and 220b by removing the plurality of first and second sacrificial layers 235a and 235b.

Figure 3J:
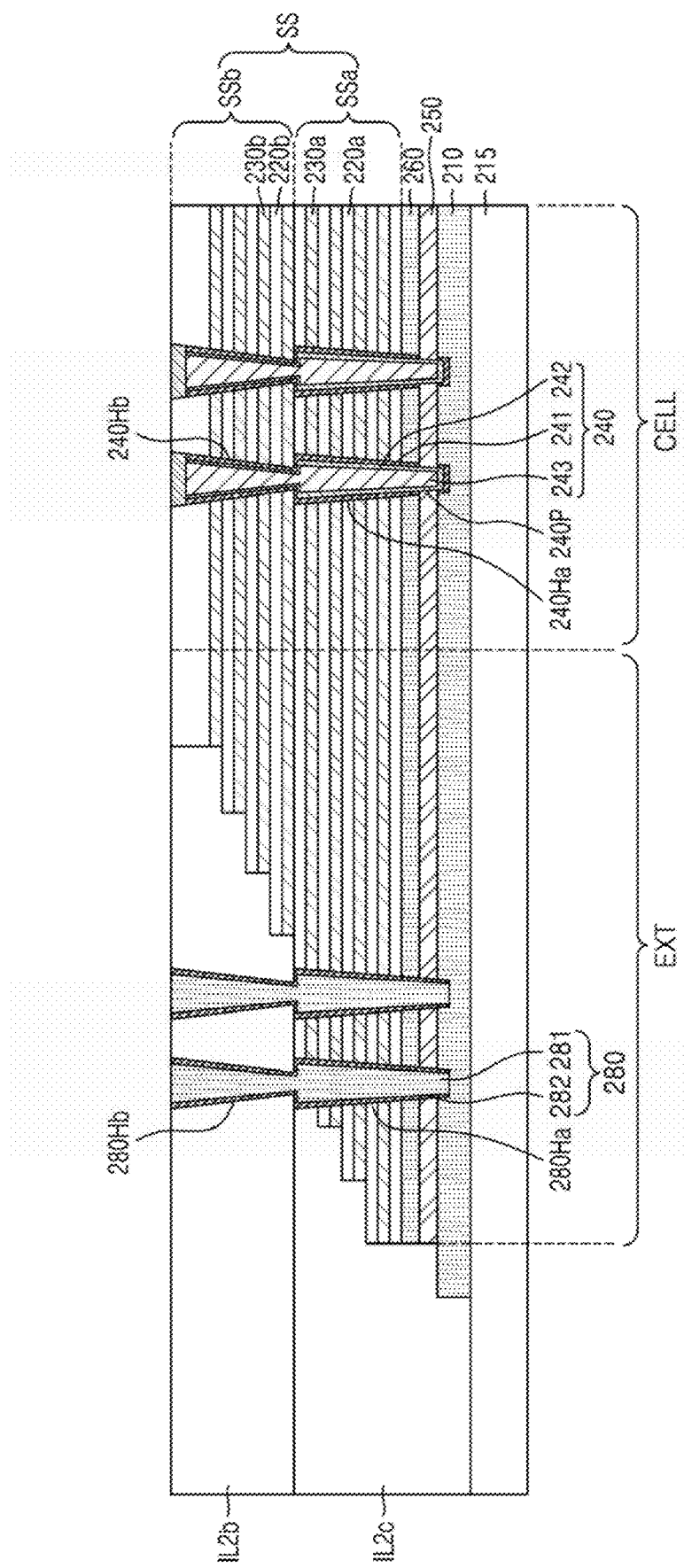

Referring to FIGS. 3I and 3J, a plurality of gate layers (e.g., a plurality of first and second gate layers 230a and 230b) may be formed in the plurality of spaces 235Ha and 235Hb between the plurality of interlayer insulating layers (e.g., the plurality of first and second interlayer insulating layers 220a and 220b). Thus, a stack structure SS including a first portion SSa including the first interlayer insulating layer 220a and the first gate layer 230a alternately stacked over the common source line layer 210 and a second portion SSb including the second interlayer insulating layer 220b and the second gate layer 230b alternately stacked on the first portion SSa may be formed.

Figure 3K:
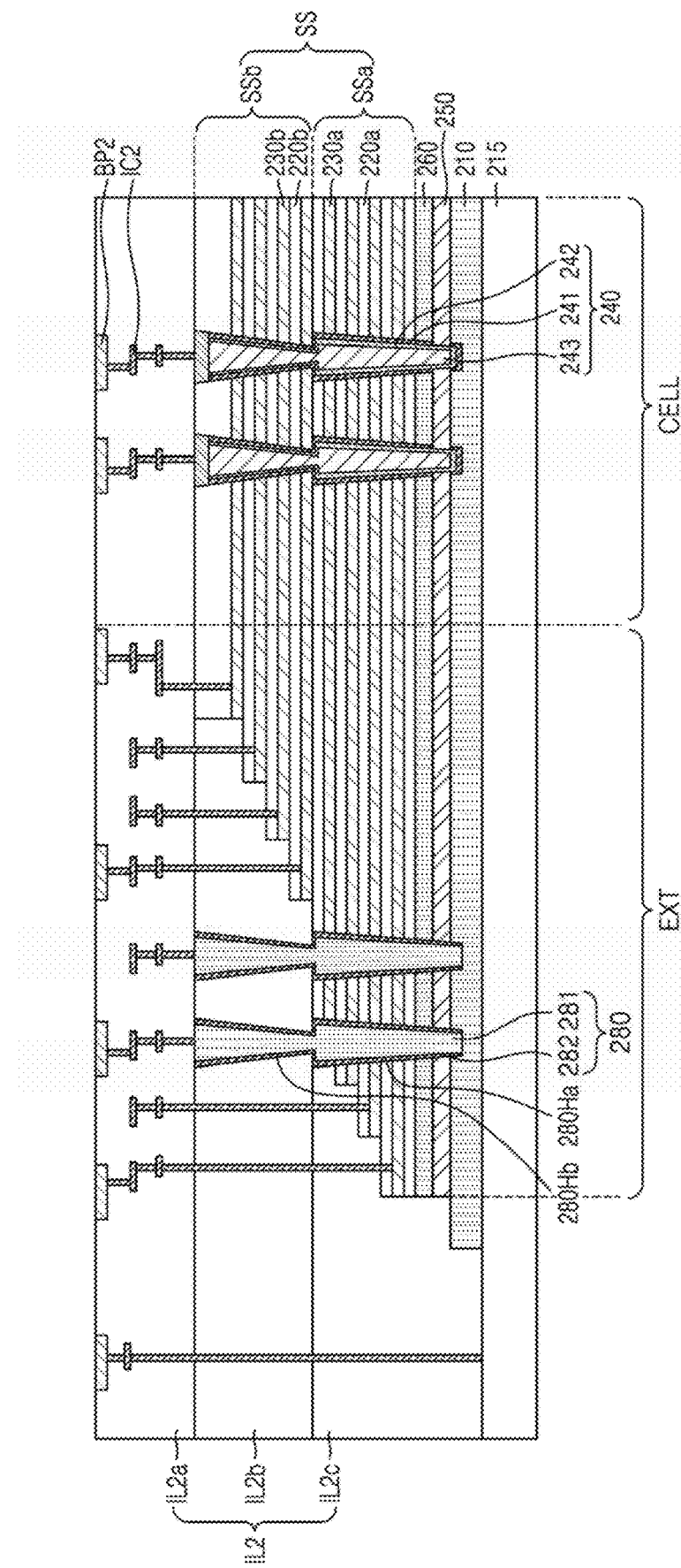

Referring to FIG. 3K, the third portion IL2a of the insulating structure IL2, the interconnect structure IC2, and a plurality of bonding pads BP2 may be formed. Thus, the insulating structure IL2 including the first portion IL2c, the second portion IL2b, and the third portion IL2a may be completed.

By way of summation and review, polishing agents could cause product defects due to scratches or contamination depending on polishing conditions.

One or more embodiments may provide a slurry composition for a CMP process, which may remove polysilicon at high speed without using an inorganic polishing agent and have a greatly improved etch selectivity with respect to a silicon oxide film or a silicon nitride film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A slurry composition for a chemical mechanical polishing (CMP) process, the slurry composition comprising:
   a first organic polishing booster including a quaternary amine group;
   a second organic polishing booster including an amino acid, which changes the selectivity of polysilicon with respect to a dielectric when included with the first organic polishing booster; and
   a carrier;
   wherein inorganic polishing particles are not included in the slurry composition, and
   wherein an etch selectivity of the slurry composition for polysilicon with respect to either of silicon oxide or silicon nitride is in a range of about 150 to about 2,000.

2. The slurry composition as claimed in claim 1, wherein the first organic polishing booster is included in the slurry composition in an amount of about 10 ppm to about 100,000 ppm by weight.

3. The slurry composition as claimed in claim 1, wherein the first organic polishing booster has a weight average molecular weight of about 1,000 to about 1,000,000.

4. The slurry composition as claimed in claim 3, wherein:
   the first organic polishing booster includes a moiety represented by one of Formulae 1 to 6:

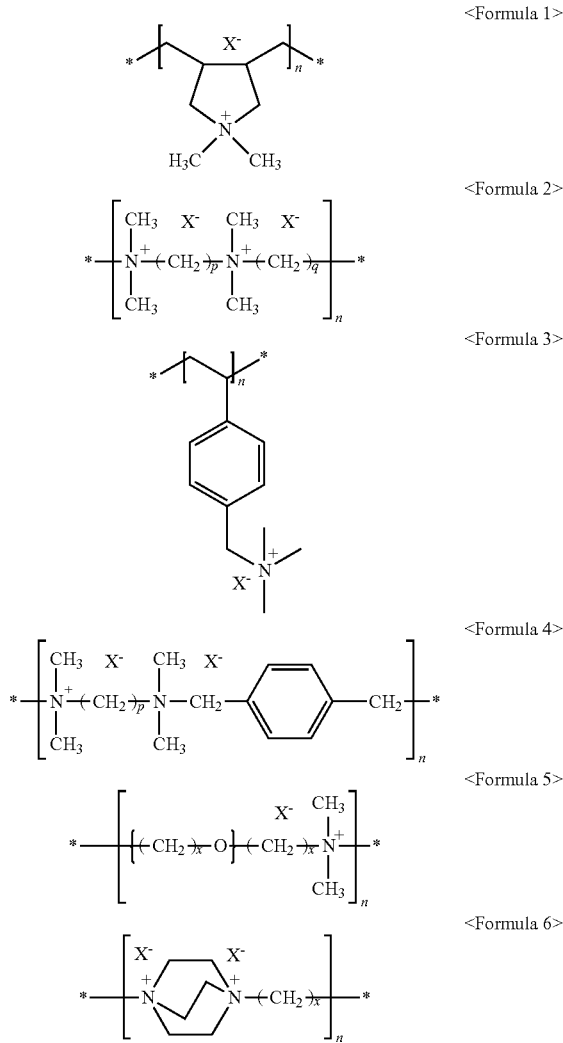

in Formulae 1 to 6,

X is fluorine (F), chlorine (Cl), bromine (Br), or iodine (I), p, q, and x are each independently an integer of 1 to 5, n is an integer that allows a weight average molecular weight of the first organic polishing booster to be in a range of 1,000 to 1,000,000, and

* is a bonding location to an adjacent atom.

5. The slurry composition as claimed in claim 1, wherein the second organic polishing booster is included in the slurry composition in an amount of about 10 ppm to about 100,000 ppm by weight.

6. The slurry composition as claimed in claim 5, wherein the second organic polishing booster includes arginine, histidine, lysine, aspartic acid, glutamic acid, serine, threonine, asparagine, glutamine, cysteine, selenocysteine, glycine, proline, alanine, valine, leucine, isoleucine, methionine, phenylalanine, tyrosine, or tryptophan.

7. The slurry composition as claimed in claim 1, wherein the slurry composition has a pH value of about 4 to about 11.

8. The slurry composition as claimed in claim 1, wherein the slurry composition does not include any of silica, alumina, ceria, titania, zirconia, magnesia, germania, and mangania.

9. The slurry composition as claimed in claim 1, wherein the slurry composition does not include a dispersion stabilizer.

10. The slurry composition of claim 1, wherein the second organic polishing booster including the amino acid increases the selectivity of polysilicon with respect to a dielectric including silicon when included with the first organic polishing booster.

11. A slurry composition for a chemical mechanical polishing (CMP) process, the slurry composition comprising:
a first organic polishing booster including a quaternary amine group, the first organic polishing booster being included in the slurry composition in an amount of about 10 ppm to about 100,000 ppm by weight;
a second organic polishing booster including an amino acid, the second organic polishing booster being included in the slurry composition in an amount of about 10 ppm to about 100,000 ppm by weight, and the second organic polishing booster changing the selectivity of polysilicon with respect to a dielectric when included with the first organic polishing booster; and
a surfactant; and
a carrier,
wherein the slurry composition does not include inorganic polishing particles, and
wherein an etch selectivity of the slurry composition for polysilicon with respect to either of silicon oxide or silicon nitride is in a range of about 150 to about 2,000.

12. The slurry composition as claimed in claim 11, wherein the first organic polishing booster has a weight average molecular weight of about 1,000 to about 1,000,000.

13. The slurry composition as claimed in claim 12, wherein:
the first organic polishing booster includes a moiety represented by one of Formulae 1 to 6:

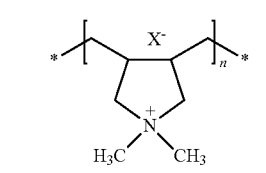
<Formula 1>

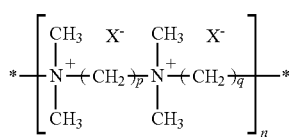
<Formula 2>

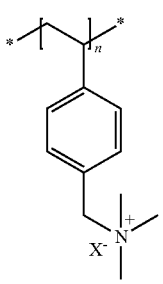
<Formula 3>

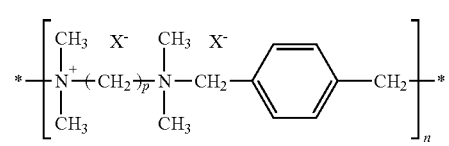
<Formula 4>

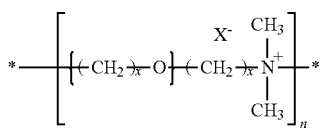
<Formula 5>

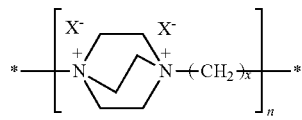
<Formula 6> in Formulae 1 to 6,
X is fluorine (F), chlorine (Cl), bromine (Br), or iodine (I),
p, q, and x are each independently an integer of 1 to 5,
n is an integer that allows a weight average molecular weight of the first organic polishing booster to be in a range of 1,000 to 1,000,000, and
* is a bonding location to an adjacent atom.

14. The slurry composition as claimed in claim 11, wherein the second organic polishing booster includes arginine, histidine, lysine, aspartic acid, glutamic acid, serine, threonine, asparagine, glutamine, cysteine, selenocysteine, glycine, proline, alanine, valine, leucine, isoleucine, methionine, phenylalanine, tyrosine, or tryptophan.

15. The slurry composition as claimed in claim 11, wherein the slurry composition has a pH value of about 8 to about 11.

16. The slurry composition as claimed in claim 11, further comprising a biocide.

17. The slurry composition as claimed in claim 11, wherein:
the first organic polishing booster includes a moiety represented by Formula 2:

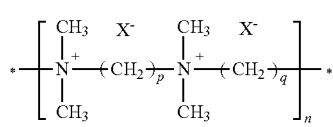
<Formula 2> in Formula 2,
X is fluorine (F), chlorine (Cl), bromine (Br), or iodine (I),
p is 6,
q is 3,
n is an integer that allows a weight average molecular weight of the first organic polishing booster to be in a range of 1,000 to 1,000,000, and
* is a bonding location to an adjacent atom.

18. The slurry composition of claim 11, wherein the second organic polishing booster including the amino acid increases the selectivity of polysilicon with respect to a dielectric including silicon when included with the first organic polishing booster.

19. A slurry composition for a chemical mechanical polishing (CMP) process for polishing polysilicon, the slurry composition comprising:

a first organic polishing booster including a quaternary amine group;
a second organic polishing booster including an amino acid, which changes the selectivity of polysilicon with respect to a dielectric when included with the first organic polishing booster;
a surfactant;
a pH control agent; and
a carrier,
wherein the slurry composition:
has a pH value of about 4 to about 11,
does not include inorganic polishing particles, and
does not include a dispersion stabilizer for uniform distribution of the inorganic polishing particles, and
wherein an etch selectivity of the slurry composition for polysilicon with respect to either of silicon oxide or silicon nitride is in a range of about 150 to about 2,000.

20. The slurry composition as claimed in claim 19, wherein the first organic polishing booster has a weight average molecular weight of about 36,000 to about 500,000.

21. The slurry composition of claim 19, wherein the second organic polishing booster including the amino acid increases the selectivity of polysilicon with respect to a dielectric including silicon when included with the first organic polishing booster.

\* \* \* \* \*